(12) United States Patent
Ra et al.

(10) Patent No.: US 12,019,871 B2
(45) Date of Patent: Jun. 25, 2024

(54) STORAGE CONTROLLER COMPRESSING INDICATOR DATA, STORAGE DEVICE INCLUDING THE SAME, AND METHOD OF OPERATING THE SAME

(71) Applicant: SAMSUNG ELECTRONICS CO., LTD., Suwon-si (KR)

(72) Inventors: Youngsuk Ra, Seoul (KR); Hanbyeul Na, Yongin-si (KR); Kwanwoo Noh, Hwaseong-si (KR); Mankeun Seo, Hwaseong-si (KR); Hong Rak Son, Anyang-si (KR); Jae Hun Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 46 days.

(21) Appl. No.: 17/865,621

(22) Filed: Jul. 15, 2022

(65) Prior Publication Data

US 2023/0185452 A1 Jun. 15, 2023

(30) Foreign Application Priority Data

Dec. 15, 2021 (KR) .......... 10-2021-0180047
Mar. 14, 2022 (KR) .......... 10-2022-0031645

(51) Int. Cl.
*G06F 3/06* (2006.01)

(52) U.S. Cl.
CPC .......... *G06F 3/0608* (2013.01); *G06F 3/0655* (2013.01); *G06F 3/0679* (2013.01)

(58) Field of Classification Search
CPC .... G06F 3/0608; G06F 3/0655; G06F 3/0679; G11C 2211/562; G11C 2211/563; G11C 11/5671; G11C 16/0483; G11C 2207/102; G11C 7/1006; H03M 7/6041
USPC .................................................. 711/207, 206
See application file for complete search history.

(56) References Cited

U.S. PATENT DOCUMENTS

| | | | |
|---|---|---|---|
| 7,921,088 B1* | 4/2011 | Mittal ................. | G06F 16/9027 707/693 |
| 9,135,155 B2 | 9/2015 | Sharon et al. | |
| 9,501,354 B2 | 11/2016 | Murakami | |
| 9,837,156 B2 | 12/2017 | Seol et al. | |
| 9,946,468 B2 | 4/2018 | Conley et al. | |
| 2016/0011807 A1* | 1/2016 | Seol .................... | G11C 11/5628 711/102 |
| 2016/0110112 A1 | 4/2016 | Yeh | |
| 2017/0269876 A1* | 9/2017 | Mukhopadhyay ..... | G11C 16/26 |
| 2019/0121549 A1 | 4/2019 | Satoyama et al. | |

(Continued)

FOREIGN PATENT DOCUMENTS

KR 10-2247087 B1 5/2021

*Primary Examiner* — David Yi
*Assistant Examiner* — Zubair Ahmed
(74) *Attorney, Agent, or Firm* — Sughrue Mion, PLLC

(57) ABSTRACT

A method of operating a storage controller includes receiving raw data indicating a series of bits each corresponding to one of threshold voltage states, performing a first state shaping for reducing a number of first target bits of the series of bits, logical values of the first target bits being equal to a logical value of a target threshold voltage state of the threshold voltage states in a first page of plural pages, generating first indicator data that indicates the first target bits based on the first state shaping, compressing the first indicator data, and storing the compressed first indicator data.

20 Claims, 14 Drawing Sheets

(56) References Cited

U.S. PATENT DOCUMENTS

| | | |
|---|---|---|
| 2019/0205035 A1 | 7/2019 | Mizushima et al. |
| 2020/0272363 A1 | 8/2020 | Sato |
| 2021/0026734 A1 | 1/2021 | Hwang et al. |
| 2021/0034251 A1 | 2/2021 | Choi et al. |

* cited by examiner

STORAGE CONTROLLER COMPRESSING INDICATOR DATA, STORAGE DEVICE INCLUDING THE SAME, AND METHOD OF OPERATING THE SAME

CROSS-REFERENCE TO RELATED APPLICATIONS

This application claims priority under 35 U.S.C. § 119 to Korean Patent Application No. 10-2021-0180047 filed on Dec. 15, 2021, and to Korean Patent Application No. 10-2022-0031645 filed on Mar. 14, 2022, in the Korean Intellectual Property Office, the disclosures of each which being incorporated by reference herein in their entireties.

BACKGROUND

Embodiments of the present disclosure described herein relate to a storage controller, and more particularly, relate to a storage controller compressing indicator data, a storage device including the same, and a method of operating the same.

A memory device stores data in response to a write request and outputs data stored therein in response to a read request. For example, the memory device is classified as a volatile memory device, which loses data stored therein when a power supply is turned off, such as a dynamic random access memory (DRAM) device or a static RAM (SRAM) device, or a non-volatile memory device, which retains data stored therein even when a power supply is turned off, such as a flash memory device, a phase-change RAM (PRAM), a magnetic RAM (MRAM), or a resistive RAM (RRAM).

Each memory cell of the non-volatile memory device may have a programmed threshold voltage state corresponding to a bit value of data. A specific threshold voltage state, which a memory cell is able to have, from among a plurality of threshold voltage states may cause a reduction of performance (e.g., a reduction in reliability and/or lifespan) of the memory cell. In this case, state shaping encoding may be used to decrease the number of bits corresponding to a threshold voltage distribution capable of degrading performance. The state shaping encoding may use indicator data indicating a specific threshold voltage state of a plurality of threshold voltage states.

SUMMARY

It is an aspect to provide a storage controller that compresses indicator data, a storage device including the same, and a method of operating the same.

According to an aspect of one or more embodiments, there is provided a method of operating a storage controller, the method comprising receiving raw data indicating a series of bits each corresponding to one of a plurality of threshold voltage states; performing a first state shaping for reducing a number of first target bits of the series of bits, logical values of the first target bits being equal to a logical value of a target threshold voltage state of the plurality of threshold voltage states in a first page of a plurality of pages; generating first indicator data that indicates the first target bits based on the first state shaping; compressing the first indicator data; and storing the compressed first indicator data.

According to another aspect of one or more embodiments, there is provided a storage controller comprising a shape encoder configured to receive raw data indicating a series of bits each corresponding to one of a plurality of threshold voltage states, to perform a first state shaping for reducing a number of first target bits of the series of bits, and to generate first indicator data that indicates the first target bits based on the first state shaping; a compressor configured to compress the first indicator data; and a volatile memory device configured to store the compressed first indicator data, wherein logical values of the first target bits are equal to a logical value of a target threshold voltage state of the plurality of threshold voltage states in a first page of a plurality of pages.

According to yet another aspect of one or more embodiments, there is provided a storage device comprising a storage controller configured to receive raw data indicating a series of bits each corresponding to one of a plurality of threshold voltage states and to perform a plurality of state shaping operations on the raw data to generate encoding data; and a non-volatile memory device configured to store the encoding data, wherein the storage controller includes a shape encoder configured to perform a first state shaping of the plurality of state shaping operations to reduce a number of first target bits of the series of bits, and to generate first indicator data that indicates the first target bits based on the first state shaping; a compressor configured to compress the first indicator data; and a volatile memory device configured to store the compressed first indicator data, wherein logical values of the first target bits are equal to a logical value of a target threshold voltage state of the plurality of threshold voltage states in a first page of a plurality of pages.

BRIEF DESCRIPTION OF THE FIGURES

The above and other aspects and features will become apparent by describing in detail embodiments thereof with reference to the accompanying drawings, in which.

DETAILED DESCRIPTION

Below, embodiments will be described in detail and clearly to such an extent that one skilled in the art may easily carry out the present disclosure.

Figure 1:
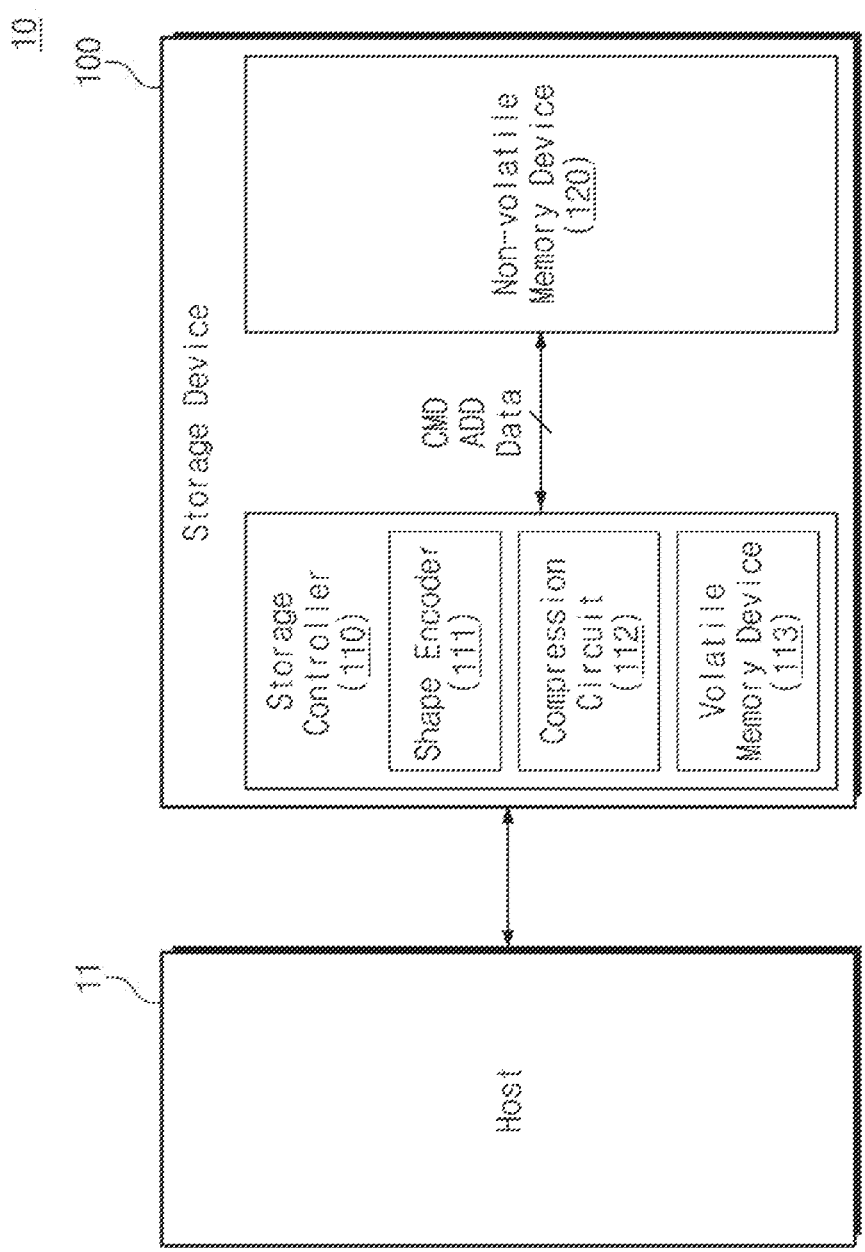
FIG. 1 is a block diagram of a storage system according to an embodiment.

FIG. 1 is a block diagram of a storage system according to an embodiment. Referring to FIG. 1, a storage system 10 may include a host 11 and a storage device 100. In some embodiments, the storage system 10 may include a computing system, which is configured to process a variety of information, such as a personal computer (PC), a notebook, a laptop, a server, a workstation, a tablet PC, a smartphone, a digital camera, and a black box.

The host 11 may control an overall operation of the storage system 10. For example, the host 11 may store data in the storage device 100 or may read data stored in the storage device 100. For example, the host 11 may provide write data to the storage device 100, or the host 11 may request read data stored in the storage device 100.

The storage device 100 may include a storage controller 110 and a non-volatile memory device 120. The non-volatile memory device 120 may store data. The storage controller 110 may store data in the non-volatile memory device 120 or may read data stored in the non-volatile memory device 120. The non-volatile memory device 120 may operate under control of the storage controller 110. For example, based on a command CMD indicating an operation and an address ADD indicating a location of data, the storage controller 110 may store the data Data in the non-volatile memory device 120 or may read the data Data stored in the non-volatile memory device 120.

In some embodiments, the non-volatile memory device 120 may be a NAND flash memory device, but embodiments are not limited thereto. For example, the non-volatile memory device 120 may be one of various storage devices, which retain data stored therein even though a power is turned off, such as a phase-change random access memory (PRAM), a magnetic random access memory (MRAM), a resistive random access memory (RRAM), and a ferroelectric random access memory (FRAM), and the like.

In some embodiments, the non-volatile memory device 120 may be implemented based on a vertical NAND (NAND). For example, the non-volatile memory device 120 may include a plurality of memory cells arranged in a direction perpendicular to a substrate. The VNAND-based memory cells will be described in detail with reference to FIG. 4.

The storage controller 110 may include a shape encoder 111, a compression circuit 112, and a volatile memory device 113.

The shape encoder 111 may encode raw data received from the host 11 and may generate encoding data. The shape encoder 111 may store the encoding data in the non-volatile memory device 120. For example, the raw data may be write data corresponding to a write command. The raw data may include a series of bits each corresponding to one of a plurality of threshold voltage states. The series of bits may be encoded and may then be stored in memory cells of the non-volatile memory device 120. The series of bits may have logical values corresponding to a logical page.

The plurality of threshold voltage states may include an erase state and a plurality of programming states. One of the plurality of threshold voltage states may be a target threshold voltage state. The target threshold voltage state may be a state targeted for encoding. Compared to the remaining threshold voltage states, the target threshold voltage state may refer to a state with a high probability of causing a reduction of performance such as the reduction of reliability or the decrease in lifetime of the non-volatile memory device 120. That is, encoding may refer to an operation of changing some of bit values of raw data for the purpose of reducing the hardware burden.

In some embodiments, the target threshold voltage state may refer to a state corresponding to the highest voltage level from among a plurality of threshold voltage states that the memory cells of the non-volatile memory device 120 are able to have. For example, as a programmed threshold voltage level increases, a retention time (e.g., a time period during which the reliability of the programmed threshold voltage level is secured) of the non-volatile memory device 120 may decrease, and the number of program/erase (P/E) cycles of the non-volatile memory device 120 may decrease. The shape encoder 111 may decrease the number of memory cells to be programmed to the target threshold voltage state (i.e., may change the target threshold voltage state into any other threshold voltage state) by performing encoding.

In some embodiments, the encoding of the shape encoder 111 may include state shaping for plural pages. The state shaping may refer to an operation of decreasing the number of target bits indicating threshold voltage states each having a logical value equal to a logical value of the target threshold voltage state, in a corresponding page of a plurality of pages (i.e., an operation of inverting logical values of some of bits indicating states with a high probability of corresponding to the target threshold voltage state, in units of page). Target bits may be some of the target bits of a previous page. All target bits corresponding to the last page (e.g., a logical page corresponding to a most significant bit) may indicate the target threshold voltage state. The memory cells of the non-volatile memory device 120 may indicate states corresponding to two or more bits.

For example, in the case where a memory cell is implemented with a multi-level cell (MLC) storing two bits, the shape encoder 111 may perform first state shaping for decreasing the number of first target bits each indicating a logical value equal to a logical value of the target threshold voltage state, in a first page corresponding to a least significant bit (LSB). Afterwards, the shape encoder 111 may perform second state shaping for decreasing the number of second target bits each indicating a logical value equal to a logical value of the target threshold voltage state and which are included in the first target bits, in a second page corresponding to a most significant bit (MSB).

However, embodiments are not limited thereto. For example, in some embodiments, a memory cell may be implemented with various types of memory cells, such as a triple level cell (TLC) and a quadruple level cell (QLC), and the like.

In some embodiments, the shape encoder 111 may generate indicator data based on the state shaping. The indicator data may indicate bits with a high probability of corresponding to a target threshold voltage state. Indicator data may be generated based on the state shaping of a current page and indicator data of a previous page. The indicator data may be used to perform the state shaping on the next page.

For example, indicator data may include a series of indicator bits. The number of indicator bits may be equal to the number of bits of raw data. Each of the indicator bits may be a flag indicating whether a bit value of a memory cell corresponds to a target threshold voltage state (i.e., the corresponding indication bit has a first value) or corresponds to an other threshold voltage state (i.e., the corresponding indication bit has a second value), wherein state shaping operations from an initial page (e.g., corresponding to a least significant bit) to the current page are applied to the memory cell having the bit value. The indicator data will be described in detail with reference to FIGS. 7 and 8.

In some embodiments, the shape encoder 111 may perform VNAND state shaping (VSS) encoding. The VSS encoding may refer to an operation of encoding raw data to be stored in the non-volatile memory device 120.

The compression circuit 112 may compress indicator data generated as a result of the shape encoding of the shape encoder 111. The compression circuit 112 may store the compressed indicator data in the volatile memory device 113. Based on a request from the shape encoder 111, the compression circuit 112 may decompress the indicator data stored in the volatile memory device 113. For example, based on a request from the shape encoder 111 that will perform the shape encoding of a next page, the compression circuit 112 may decompress the indicator data stored in the volatile memory device 113 and may provide the decompressed indicator data to the shape encoder 111. The decompressed indicator data may be used for the shape encoder 111 to perform the state shaping on the next page. That is, the compression circuit 112 may refer to a device that manages the compression and decompression of indicator data.

In some embodiments, the compression circuit 112 may use a compression algorithm optimized for each page. The compression algorithm of the compression circuit 112 will be described in detail with reference to FIGS. 10 and 11.

The volatile memory device 113 may refer to a memory device that temporarily stores data. The volatile memory device 113 may receive the compressed indicator data from the compression circuit 112. The volatile memory device 113 may store the compressed indicator data. The volatile memory device 113 may provide the stored indicator data to the compression circuit 112 based on a request from the shape encoder 111.

As described above, according to an embodiment, the storage device 100 may encode raw data and may store encoding data instead of the raw data, and thus, the reduction of performance of the non-volatile memory device 120 may be suppressed. Because the storage device 100 compresses indicator data to be used in encoding, a required capacity of the volatile memory device 113 and a size of an area used for the volatile memory device 113 may decrease.

Figure 2:
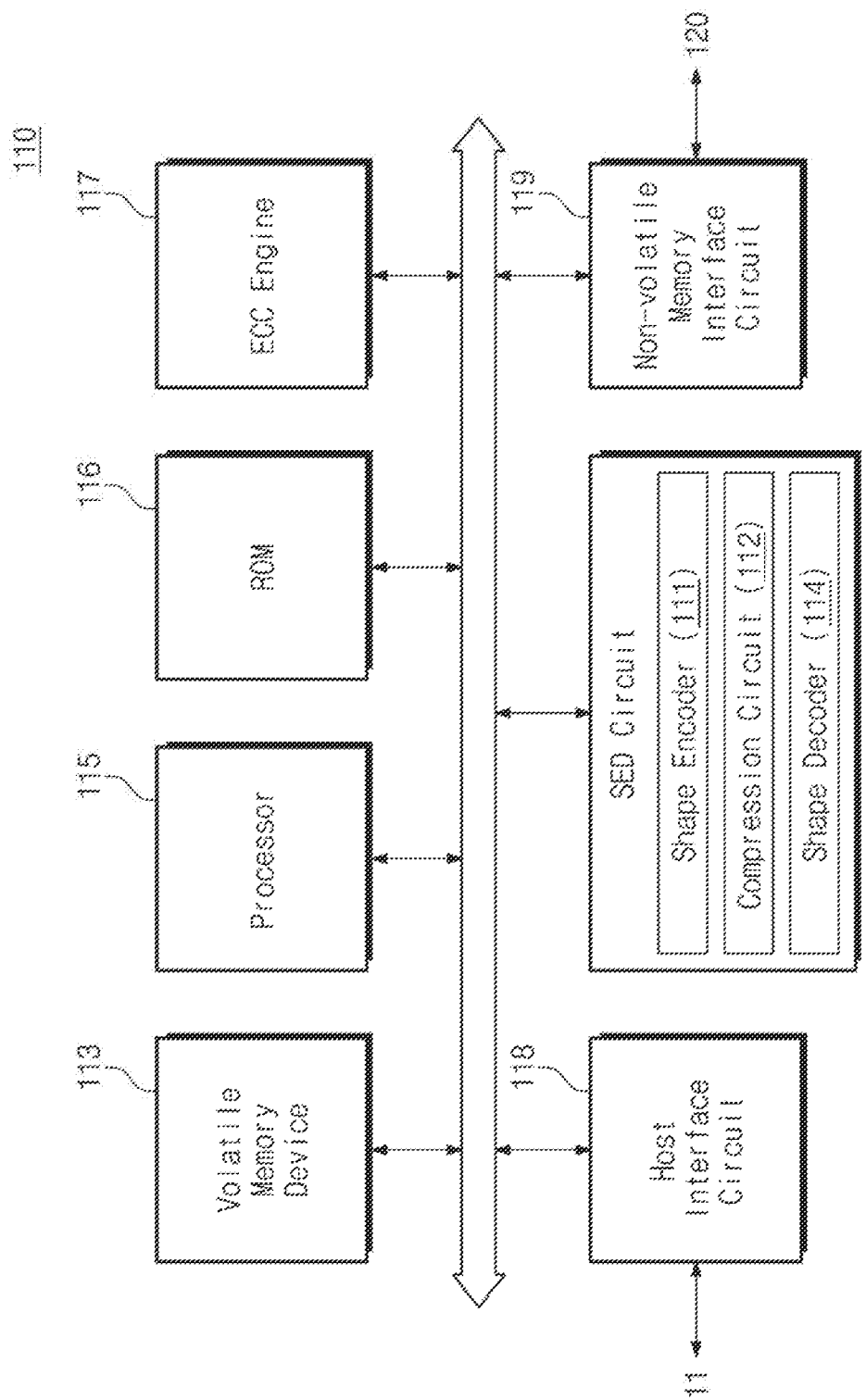
FIG. 2 is a block diagram illustrating a storage controller of the storage system of FIG. 1 in detail, according to some embodiments.

FIG. 2 is a block diagram illustrating a storage controller of the storage system of FIG. 1 in detail, according to some embodiments. Referring to FIGS. 1 and 2, the storage controller 110 may communicate with the host 11 and the non-volatile memory device 120.

The storage controller 110 may include the shape encoder 111, the compression circuit 112, the volatile memory device 113, a shape decoder 114, a processor 115, a read only memory (ROM) 116, an error correcting code (ECC) engine 117, a host interface circuit 118, and a non-volatile memory interface circuit 119. The shape encoder 111, the compression circuit 112, and the shape decoder 114 may be collectively referred to as a "shape encoding decoding (SED) circuit". The SED circuit may manage encoding and decoding operations that are based on the state shaping. The shape encoder 111, the compression circuit 112, and the volatile memory device 113 may respectively correspond to the shape encoder 111, the compression circuit 112, and the volatile memory device 113 of FIG. 1.

The volatile memory device 113 may be used as a main memory, a buffer memory, a cache memory, or a working memory of the storage controller 110. For example, the volatile memory device 113 may be implemented with a static random access memory (SRAM) or a dynamic random access memory (DRAM). The volatile memory device 113 may temporarily store indicator data that are generated based on the state shaping of the shape encoder 111 and are compressed by the compression circuit 112.

The shape decoder 114 may decode the data encoded by the shape encoder 111. For example, the shape encoder 111 may receive a write command and raw data from the host 11, may encode the raw data, and may store the encoded data (or encoding data) in the non-volatile memory device 120, as discussed above. The shape decoder 114 may receive a read command from the host 11, may decode the encoding data from the non-volatile memory device 120, and may provide the host 11 with the decoded data (or decoding data) as read data.

In some embodiments, the shape decoder 114 may perform VSS decoding. The VSS decoding may refer to an operation corresponding to the VSS encoding of the shape encoder 111. The VSS decoding may refer to an operation of decoding the encoding data stored in the VNAND-based non-volatile memory device 120.

The processor 115 may control an overall operation of the storage controller 110. In some embodiments, the processor 115 may be a central processing unit (CPU), a graphics processing unit (GPU), an application specific integrated circuit (ASIC), a microprocessor, or the like. In some embodiments, the processor 115 may include a plurality of processors. The ROM 116 may be used as a read only memory that stores information used for the operation of the storage controller 110. The ECC engine 117 may detect and correct an error of data read from the non-volatile memory device 120. For example, the ECC engine 117 may have an error correction capability of a given level. The ECC engine 117 may process data having an error level (e.g., a number of flipped bits) exceeding the error correction capability as an uncorrectable error.

The storage controller 110 may communicate with the host 11 through the host interface circuit 118. In some embodiments, the host interface circuit 118 may be implemented based on at least one of various interfaces such as a serial ATA (SATA) interface, a peripheral component interconnect express (PCIe) interface, a serial attached SCSI (SAS), a nonvolatile memory express (NVMe) interface, and/or an universal flash storage (UFS) interface.

The storage controller 110 may communicate with the non-volatile memory device 120 through the non-volatile memory interface circuit 119. In some embodiments, the non-volatile memory interface circuit 119 may be implemented based on a NAND interface.

Figure 3:
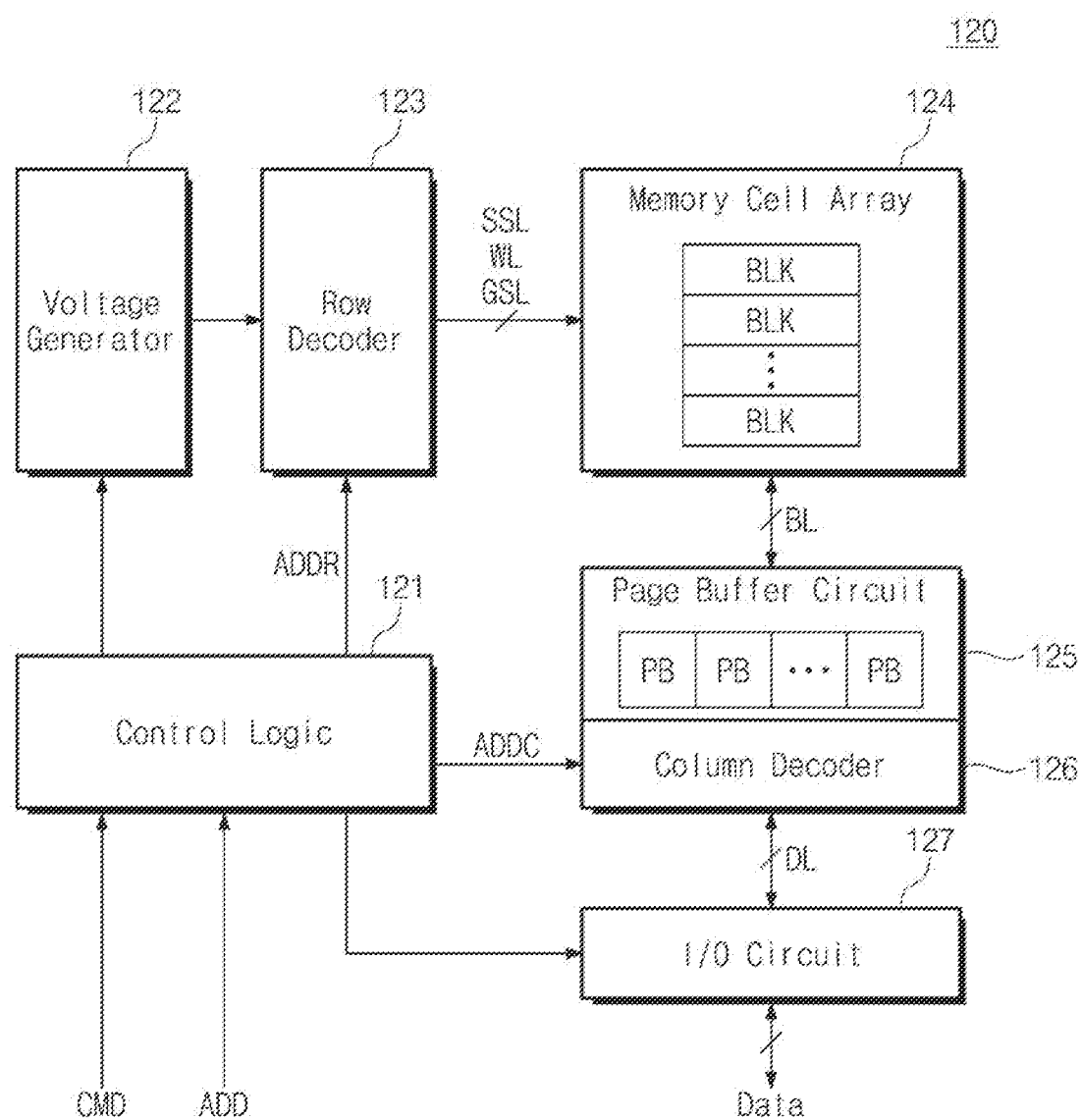
FIG. 3 is a block diagram illustrating a non-volatile memory device of the storage system of FIG. 1 in detail, according to some embodiments.
Figure 4:
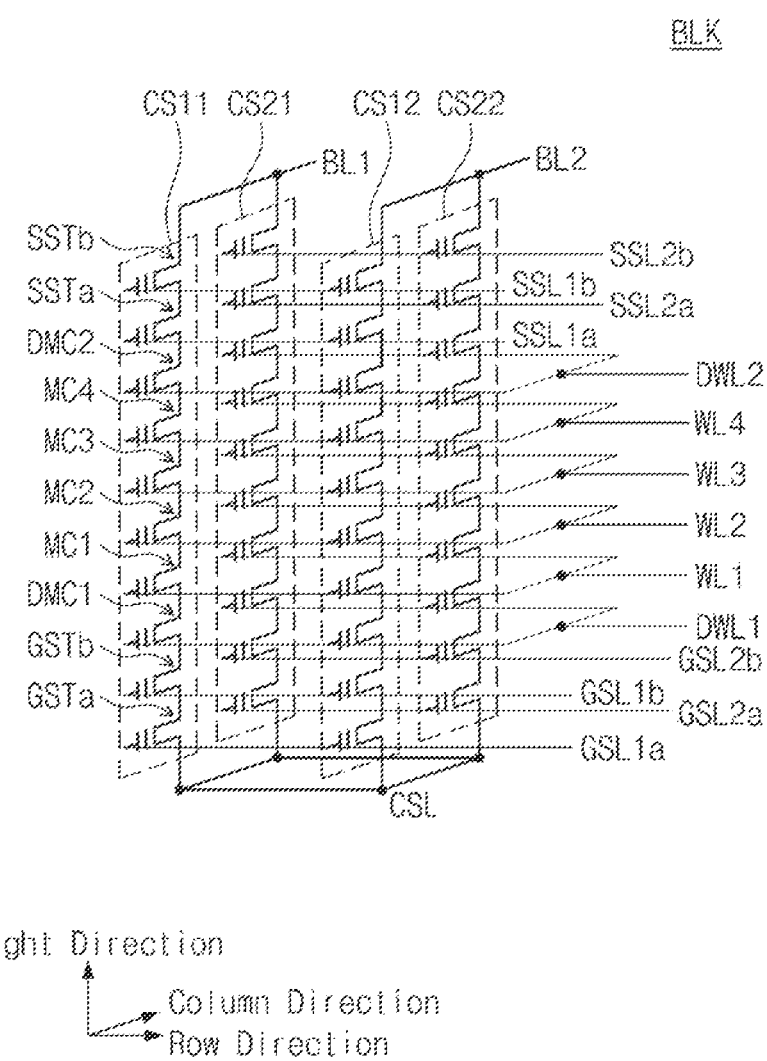
FIG. 4 is a diagram describing a memory block of a memory cell array of the non-volatile member device of FIG. 3, according to some embodiments.

FIG. 3 is a block diagram illustrating a non-volatile memory device of the storage system of FIG. 1 in detail, according to some embodiments. FIG. 4 is a diagram describing a memory block of a memory cell array oft non-volatile memory device of FIG. 3, according to some embodiments. Referring to FIGS. 1, 3, and 4, the non-volatile memory device 120 may communicate with the storage controller 110. For example, the non-volatile memory device 120 may receive the address ADD and the command CMD from the storage controller 110. The non-volatile memory device 120 may exchange data Data with the storage controller 110.

The non-volatile memory device 120 may include control logic 121, a voltage generator 122, a row decoder 123, a memory cell array 124, a page buffer circuit 125, a column decoder 126, and an input/output (I/O) circuit 127.

The control logic 121 may receive the command CMD and the address ADD from the storage controller 110. The command CMD may refer to a signal indicating an operation to be performed by the non-volatile memory device 120, such as a read operation, a write operation, or an erase operation. The address ADD may include a row address ADDR and a column address ADDC. The control logic 121 may control an overall operation of the non-volatile memory device 120 based on the command CMD and the address ADD. The control logic 121 may generate the row address ADDR and the column address ADDC based on the address ADD.

Under control of the control logic 121, the voltage generator 122 may control voltages to be applied to the memory cell array 124 through the row decoder 123.

The row decoder 123 may receive the row address ADDR from the control logic 121. The row decoder 123 may be connected with the memory cell array 124 through string selection lines SSL, word lines WL, and ground selection lines GSL. The row decoder 123 may decode the row address ADDR and may control voltages to be applied to the string selection lines SSL, the word lines WL, and the ground selection lines GSL based on a decoding result and a voltage(s) received from the voltage generator 122.

The memory cell array 124 may include a plurality of memory blocks BLK. The number of the memory blocks BLK is not particularly limited. Each of the plurality of memory blocks BLK may be similar in structure to a memory block BLK illustrated in FIG. 4. The memory block BLK illustrated in FIG. 4 may correspond to a physical erase unit of the non-volatile memory device 120, but embodiments are not limited thereto. For example, the physical erase unit may be changed to a page unit, a word line unit, a sub-block unit, or the like.

As illustrated in FIG. 4, the memory block BLK may include a plurality of cell strings CS11, CS12, CS21, and CS22. The plurality of cell strings CS11, CS12, CS21, and CS22 may be arranged in a row direction and a column direction. For brevity, 4 cell strings CS11, CS12, CS21, and CS22 are illustrated in FIG. 4, but embodiments are not limited thereto. For example, the number of cell strings may be greater than 4. That is, in some embodiments, the number of cell strings may be increased or decreased in the row direction or the column direction.

Cell strings placed at the same column from among the plurality of cell strings CS11, CS12, CS21, and CS22 may be connected with the same bit line. For example, the cell strings CS11 and CS21 may be connected with a first bit line BL1, and the cell strings CS12 and CS22 may be connected with a second bit line BL2. Each of the plurality of cell strings CS11, CS12, CS21, and CS22 may include a plurality of cell transistors. Each of the plurality of cell transistors may be implemented with a charge trap flash (CTF) memory cell. The plurality of cell transistors may be stacked in a height direction that is a direction perpendicular to a plane (e.g., a semiconductor substrate (not illustrated)) defined by the row direction and the column direction.

The plurality of cell transistors may be connected in series between a corresponding bit line (e.g., BL1 or BL2) and a common source line CSL. For example, the plurality of cell transistors may include string selection transistors SSTa and SSTb, first dummy memory cell DMC1 and second dummy memory cell DMC2, memory cells MC1 to MC4, and ground selection transistors GSTa and GSTb. The serially-connected string selection transistors SSTa and SSTb may be provided between the serially-connected memory cells MC1 to MC4 and the corresponding bit line (e.g., BL1 and BL2). The serially-connected ground selection transistors GSTa and GSTb may be provided between the serially-connected memory cells MC1 to MC4 and the common source line CSL.

In some embodiments, the second dummy memory cell DMC2 may be provided between the serially-connected string selection transistors SSTa and SSTb and the serially-connected memory cells MC1 to MC4, and the first dummy memory cell DMC1 may be provided between the serially-connected memory cells MC1 to MC4 and the serially-connected ground selection transistors GSTa and GSTb.

Memory cells placed at the same height from among the memory cells MC1 to MC4 of the plurality of cell strings CS11, CS12, CS21, and CS22 may share the same word line. For example, the first memory cells MC1 of the plurality of cell strings CS11, CS12, CS21, and CS22 may be placed at the same height from the substrate (not illustrated) and may share a first word line WL1. The second memory cells MC2 of the plurality of cell strings CS11, CS12, CS21, and CS22 may be placed at the same height from the substrate (not illustrated) and may share a second word line WL2. Likewise, the third memory cells MC3 of the plurality of cell strings CS11, CS12, CS21, and CS22 may be placed at the same height from the substrate (not illustrated) and may share a third word line WL3, and the fourth memory cells MC4 of the plurality of cell strings CS11, CS12, CS21, and CS22 may be placed at the same height from the substrate (not illustrated) and may share a fourth word line WL4.

Dummy memory cells placed at the same height from among the first and second dummy memory cells DMC1 and DMC2 of the plurality of cell strings CS11, CS12, CS21, and CS22 may share the same dummy word line. For example, the first dummy memory cells DMC1 of the plurality of cell strings CS11, CS12, CS21, and CS22 may share a first dummy word line DWL1, and the second dummy memory cells DMC2 of the plurality of cell strings CS11, CS12, CS21, and CS22 may share a second dummy word line DWL2.

String selection transistors placed at the same height and the same row from among the string selection transistors SSTa and SSTb of the plurality of cell strings CS11, CS12, CS21, and CS22 may be connected with the same string selection line. For example, the string selection transistors SSTb of the cell strings CS11 and CS12 may be connected with a string selection line SSL1*b*, and the string selection transistors SSTa of the cell strings CS11 and CS12 may be connected with a string selection line SSL1*a*. The string selection transistors SSTb of the cell strings CS21 and CS22 may be connected with a string selection line SSL2*b*, and the string selection transistors SSTa of the cell strings CS21 and CS22 may be connected with a string selection line SSL2*a*.

Ground selection transistors placed at the same height and the same row from among the ground selection transistors GSTa and GSTb of the plurality of cell strings CS11, CS12, CS21, and CS22 may be connected with the same ground selection line. For example, the ground selection transistors GSTb of the cell strings CS11 and CS12 may be connected with a ground selection line GSL1*b*, and the ground selection transistors GSTa of the cell strings CS11 and CS12 may be connected with a ground selection line GSL1*a*. The ground selection transistors GSTb of the cell strings CS21 and CS22 may be connected with a ground selection line GSL2*b*, and the ground selection transistors GSTa of the cell strings CS21 and CS22 may be connected with a ground selection line GSL2*a*.

The memory block BLK illustrated in FIG. 4 is an example. In some embodiments, the number of cell strings may be increased or decreased, and the number of rows of cell strings and the number of columns of cell strings may be increased or decreased from the number illustrated in FIG. 4, depending on the number of cell strings. Also, in the memory block BLK, the number of cell transistors may be increased or decreased, the height of the memory block BLK may be increased or decreased depending on the number of cell transistors, and the number of lines connected with the cell transistors may be increased or decreased depending on the number of cell transistors.

In some embodiments, the memory block BLK may include a plurality of memory pages. For example, the first memory cells MC1 of the cell strings CS11, CS12, CS21, and CS22 connected with the first word line WL1 may be referred to as a "first physical page". In some embodiments, one physical page may correspond to a plurality of logical pages. For example, in the case where the first memory cell MC1 is a triple level cell (TLC) storing information corresponding to 3 bits, a physical page may correspond to 3 logical pages.

As described above, according to embodiments, the memory cell array 124 of the non-volatile memory device 120 may include VNAND-based memory blocks BLK.

Referring again to FIGS. 1 and 3, the page buffer circuit 125 may include a plurality of page buffers PB. The page buffer circuit 125 may be connected with the memory cell array 124 through the bit lines BL. The page buffer circuit 125 may read data from the memory cell array 124 in units of page, by sensing voltages of the bit lines BL.

The column decoder 126 may receive the column address ADDC from the control logic 121. The column decoder 126 may decode the column address ADDC and may provide the data read by the page buffer circuit 125 to the I/O circuit 127 based on a decoding result.

The column decoder 126 may receive data from the I/O circuit 127 through data lines DL. The column decoder 126 may receive the column address ADDC from the control logic 121. The column decoder 126 may decode the column address ADDC and may provide the data received from the I/O circuit 127 to the page buffer circuit 125 based on a decoding result. The page buffer circuit 125 may store the data provided from the I/O circuit 127 in the memory cell array 124 through the bit lines BL in units of page.

The I/O circuit 127 may be connected with the column decoder 126 through the data lines DL. The I/O circuit 127 may provide data received from the storage controller 110 to the column decoder 126 through the data lines DL. The I/O circuit 127 may output data received through the data lines DL to the storage controller 110.

In some embodiments, data that the I/O circuit 127 receives from the storage controller 110 depending on the write command, that is, data that are received from the storage controller 110 and are stored in the memory cell array 124 may be encoding data to which the VSS encoding is applied. Also, data that the I/O circuit 127 receives from the memory cell array 124 depending on the read command, that is, data that are provided to the storage controller 110 may be encoding data to which the VSS encoding is applied. The encoding data may be provided to the host 11 as read data after being decoded through the VSS decoding of the storage controller 110.

Figure 5:
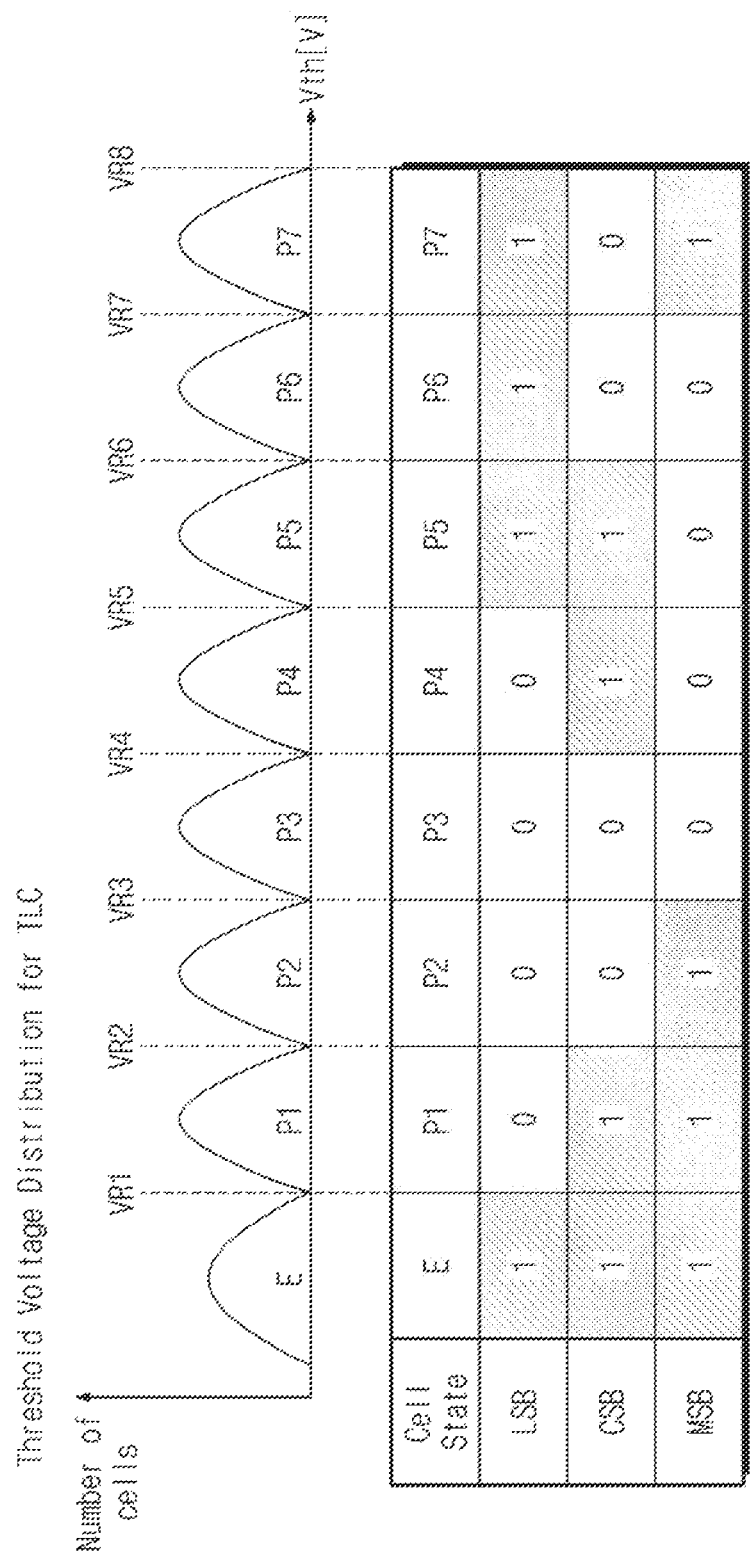
FIG. 5 is a diagram illustrating threshold voltage distributions of triple level cells according to some embodiments.

FIG. 5 is a diagram illustrating threshold voltage distributions of triple level cells according to some embodiments. A graph of threshold voltage distributions of the triple level cells TLC each storing 3 bits and a bit table for each page corresponding to the threshold voltage distributions are illustrated in FIG. 5.

In the graph of the triple level cell TLC, a horizontal axis represents a threshold voltage Vth in volts (e.g., a level of a threshold voltage), and a vertical axis represents the number of cells. The triple level cell TLC may have one of an erase state "E" and first to seventh programming states P1, P2, P3, P4, P5, P6, and P7 in which threshold voltage distributions sequentially increase.

In the triple level cell TLC, a first read voltage VR1 may be a voltage for distinguishing the erase state "E" from the first programming state P1. Likewise, each of second to seventh read voltages VR2 to VR7 may be a voltage for distinguishing each of the second to seventh programming states P2 to P7, respectively, from a previous state (i.e., an immediately previous state having a low threshold voltage distribution).

Referring to the table of the triple level cell TLC, a least significant bit LSB, a center significant bit CSB, and a most significant bit MSB according to a cell state are illustrated. A physical page corresponding to the triple level cell TLC storing 3 bits may correspond to a first logical page, a second logical page, and a third logical page. In the triple level cell TLC, the first logical page may indicate the least significant bit LSB, the second logical page may indicate the center significant bit CSB, and the third logical page may indicate the most significant bit MSB.

In some embodiments, each of the first to seventh read voltages VR1 to VR7 of the triple level cell TLC may correspond to one of a plurality of logical pages. For example, in the triple level cell TLC, a read operation corresponding to the first logical page may be performed based on the first read voltage VR1 and the fifth read voltage VR5. A read operation corresponding to the second logical page may be performed based on the second read voltage VR2, the fourth read voltage VR4, and the sixth read voltage VR6. A read operation corresponding to the third logical page may be performed based on the third read voltage VR3 and the seventh read voltage VR7.

In some embodiments, in the case of performing the VSS encoding on memory cells, that is, the triple level cells TLC, a target threshold voltage state may be the seventh programming state P7. For example, the triple level cell TLC may have one of the erase state "E" and the first to seventh programming states P1, P2, P3, P4, P5, P6, and P7. The target threshold voltage state for the VSS encoding may be the seventh programming state P7 being a state corresponding to the highest voltage level from among a plurality of threshold voltage states that the triple level cell TLC is able to have.

Figure 6:
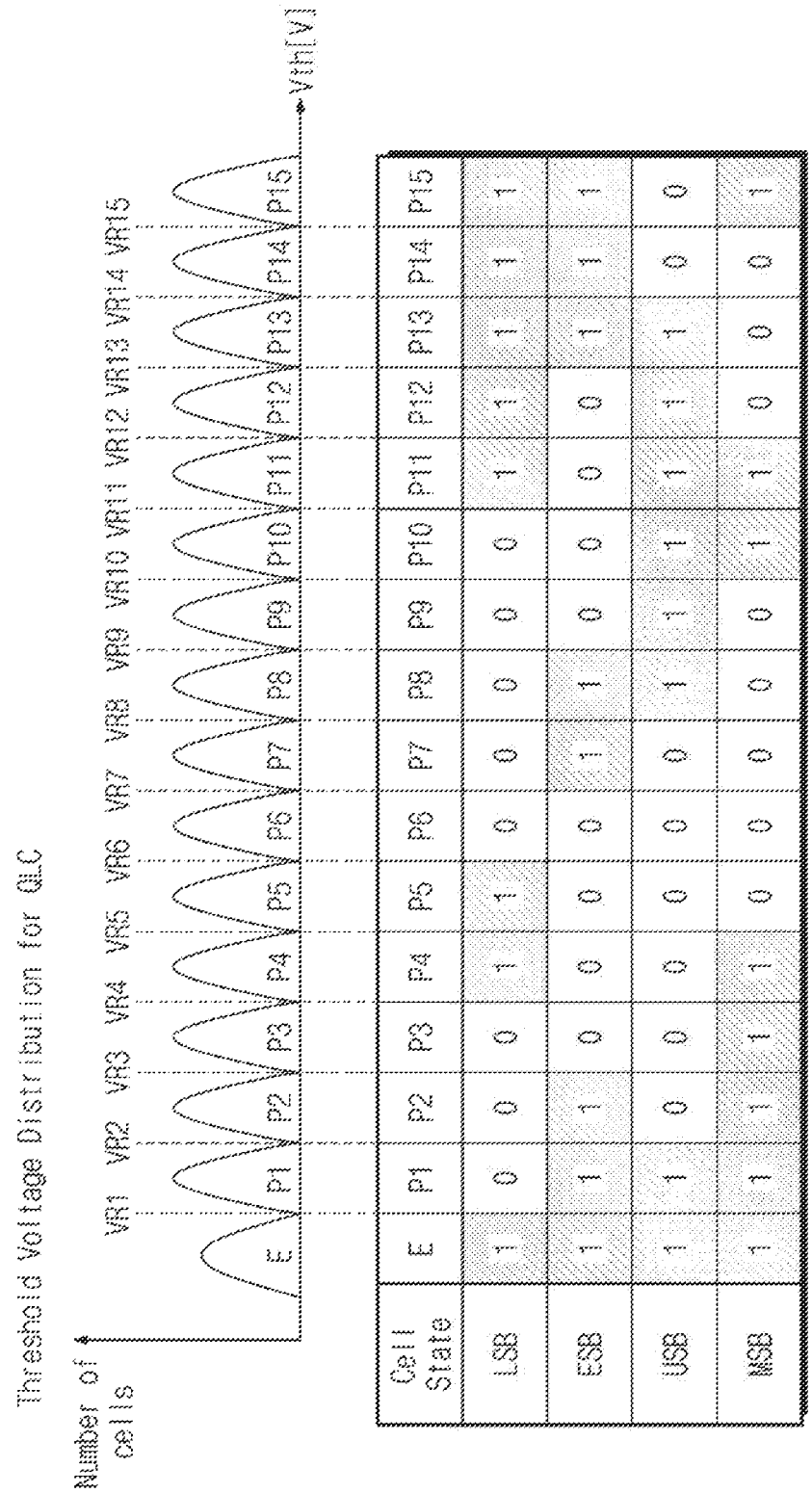
FIG. 6 is a diagram illustrating threshold voltage distributions for quadruple level cells according to some embodiments.

FIG. 6 is a diagram illustrating threshold voltage distributions for quadruple level cells according to some embodiments. A graph of threshold voltage distributions of the quadruple level cells QLC storing 4 bits and a bit table for each page corresponding to the threshold voltage distributions are illustrated in FIG. 6.

In the graph of the quadruple level cell QLC, a horizontal axis represents a threshold voltage Vth in volts (e.g., a level of a threshold voltage), and a vertical axis represents the number of cells. The quadruple level cell QLC may have one of an erase state "E" and first to fifteenth programming states P1, P2, P3, P4, P5, P6, P7, P8, P9, P10, P11, P12, P13, P14, and P15 in which threshold voltage distributions sequentially increase.

In the quadruple level cell QLC, a first read voltage VR1 may be a voltage for distinguishing the erase state "E" from the first programming state P1. Likewise, each of second to fifteenth read voltages VR2 to VR15 may be a voltage for distinguishing each of the second to fifteenth programming states P2 to P15, respectively, from a previous state (i.e., an immediately previous state having a low threshold voltage distribution).

Referring to the table of the quadruple level cell QLC, a least significant bit LSB, a first center significant bit ESB, a second center significant bit USB, and a most significant bit MSB according to a cell state are illustrated. A physical page corresponding to the quadruple level cell QLC storing 4 bits may correspond to a first logical page, a second logical page, a third logical page, and a fourth logical page. In the quadruple level cell QLC, the first logical page may indicate the least significant bit LSB, the second logical page may indicate the first center significant bit ESB, the third logical page may indicate the second center significant bit USB, and the fourth logical page may indicate the most significant bit MSB.

In some embodiments, each of the first to fifteenth read voltages VR1 to VR15 of the quadruple level cell QLC may correspond to one of a plurality of logical pages. For example, in the quadruple level cell QLC, a read operation corresponding to the first logical page may be performed based on the first, fourth, sixth, and eleventh read voltages VR1, VR4, VR6, and VR11. A read operation corresponding to the second logical page may be performed based on the third, seventh, ninth, and thirteenth read voltages VR3, VR7, VR9, and VR13. A read operation corresponding to the third logical page may be performed based on the second, eighth, and fourteenth read voltages VR2, VR8, and VR14. A read operation corresponding to the fourth logical page may be performed based on the fifth, tenth, twelfth, and fifteenth read voltages VR5, VR10, VR12, and VR15.

In some embodiments, in the case of performing the VSS encoding on memory cells, that is, the quadruple level cells QLC, a target threshold voltage state may be the fifteenth programming state P15. For example, the quadruple level cell QLC may have one of the erase state "E" and the first to fifteenth programming states P1, P2, P3, P4, P5, P6, P7, P8, P9, P10, P11, P12, P13, P14, and P15. The target threshold voltage state for the VSS encoding may be the fifteenth programming state P15 being a state corresponding to the highest voltage level from among a plurality of threshold voltage states that the quadruple level cell QLC is able to have.

As described above, the states and the read voltages of the triple level cell TLC and the quadruple level cell QLC are described with reference to FIGS. 5 and 6, respectively. However, embodiments are not limited thereto. For example, one skilled in the art may understand that read voltages corresponding to each logical page are variously changed or modified, and that, in some embodiments, one memory cell may be implemented with a multi-level cell MLC storing 2 bits, or in other embodiments, one memory cell may store bits, the number of which is 4 or more.

Figure 7:
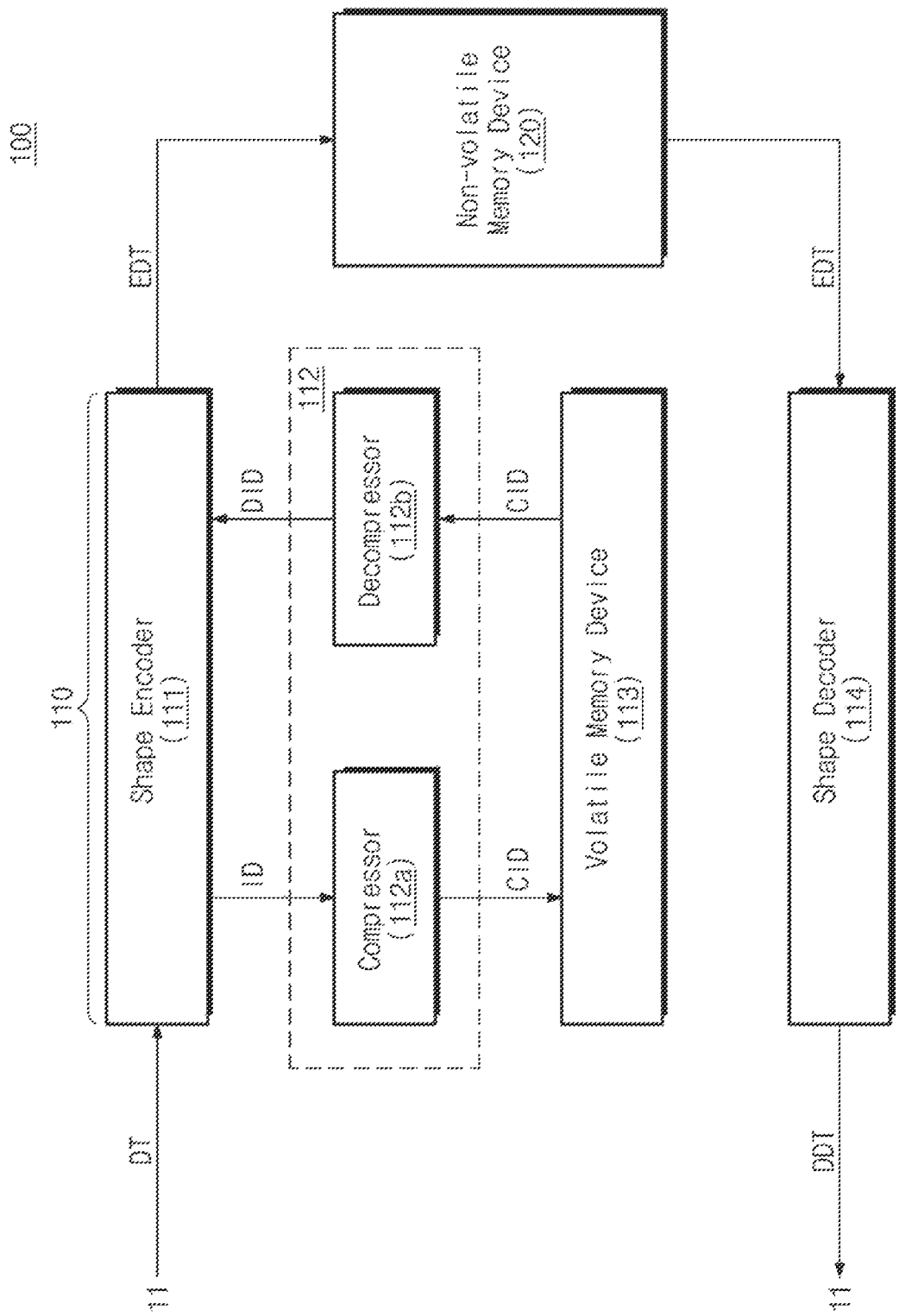
FIG. 7 is a block diagram of a storage device according to some embodiments.

FIG. 7 is a block diagram of a storage device according to some embodiments. The storage device 100 according to some embodiments of the present disclosure is illustrated in FIG. 7. The storage device 100 may communicate with the host 11.

The storage device 100 may include the storage controller 110 and the non-volatile memory device 120. The storage controller 110 may include the shape encoder 111, the compression circuit 112, the volatile memory device 113, and the shape decoder 114. The compression circuit 112 may include a compressor 112a and a decompressor 112b. The shape encoder 111, the compression circuit 112, and the volatile memory device 113 may respectively correspond to the shape encoder 111, the compression circuit 112, and the volatile memory device 113 of the storage system of FIG. 1. The shape decoder 114 may correspond to the shape decoder 114 of the storage controller FIG. 2.

The shape encoder 111 may receive raw data DT from the host 11. The raw data DT may be write data corresponding to the write command. The raw data DT may include a series of bits each corresponding to one of a plurality of threshold voltage states. A series of bits may be encoded and may then be stored in memory cells of the non-volatile memory device 120.

The number of values that one bit of a series of bits is able to have may be determined depending on a type of a memory cell (e.g., a multi-level cell MLC, a triple level cell TLC, or a quadruple level cell QLC). For example, in the case where a memory cell is a triple level cell TLC, one bit of a series of bits of the raw data DT may indicate one of logical values "111", "110", "100", "000", "010", "011", "001", and "101" respectively corresponding to the erase state "E" and the first to seventh programming states P1, P2, P3, P4, P5, P6, and P7 (refer to FIG. 5).

The shape encoder 111 may perform the state shaping as a portion of an operation of encoding the raw data DT. That is, a state shaping operation may be included in the encoding operation performed by the shape encoder 111. The state shaping may be performed in units of page. The shape encoder 111 may generate indicator data ID based on the state shaping. The indicator data ID may indicate bits with a high probability of corresponding to a target threshold voltage state. The indicator data ID may be used to perform the state shaping on a next page. The shape encoder 111 may generate encoding data EDT based on performing the state shaping on all pages.

For example, in the case where a memory cell of the non-volatile memory device 120 is a triple level cell TLC, the shape encoder 111 may perform first state shaping on a first logical page corresponding to the least significant bit LSB and may generate first indicator data based on the first state shaping. The shape encoder 111 may perform second state shaping on a second logical page corresponding to the center significant bit CSB based on the first indicator data and the series of bits to which the first state shaping is applied, and may generate second indicator data based on the second state shaping. The shape encoder 111 may perform third state shaping on a third logical page corresponding to the most significant bit MSB based on the second indicator data and the series of bits to which the second state shaping is applied. The bits experiencing the third state shaping may be referred to as "encoding data EDT". In this case, the indicator data ID may indicate the first indicator data or the second indicator data. In some embodiments, the indicator data ID may indicate both the first and second indicator data.

The shape encoder 111 may store the encoding data EDT in the non-volatile memory device 120. When the encoding data EDT are stored in the non-volatile memory device 120, the write command from the host 11 may be completely processed.

The compressor 112a may receive the indicator data ID from the shape encoder 111. The compressor 112a may compress the indicator data ID. The compressor 112a may store the compressed indicator data CID in the volatile memory device 113.

In some embodiments, the compressor 112a may generate the compressed indicator data CID by using a compression algorithm optimized for each page. For example, in the case where a memory cell of the non-volatile memory device 120 is a triple level cell TLC, the compressor 112a may compress the first indicator data by using a first compression algorithm optimized for the first logical page corresponding to the least significant bit LSB. The compressor 112a may compress the second indicator data by using a second compression algorithm optimized for the second logical page corresponding to the center significant bit CSB.

The volatile memory device 113 may receive the compressed indicator data CID from the compressor 112a. The volatile memory device 113 may store the compressed indicator data CID. In the case where the shape encoder 111 performs the state shaping on a next page, the volatile memory device 113 may provide the decompressor 112b with the compressed indicator data CID based on a request of the shape encoder 111.

The decompressor 112b may receive the compressed indicator data CID from the volatile memory device 113. The decompressor 112b may decompress the compressed indicator data CID. The decompressor 112b may provide decompressed indicator data DID to the shape encoder 111. The shape encoder 111 may perform the state shaping based on the decompressed indicator data DID.

When the state shaping corresponds to the last page, the shape encoder 111 may store the encoding data EDT in the non-volatile memory device 120. When the state shaping does not correspond to the last page, there may be repeated the operations of generating the indicator data ID, storing the compressed indicator data CID in the volatile memory device 113, decompressing the compressed indicator data CID, and performing the state shaping on a next page.

The non-volatile memory device 120 may receive the encoding data EDT from the shape encoder 111. The encoding data EDT may be data that indicate the same content as the raw data DT but include some bit values that are changed such that the hardware burden of the non-volatile memory device 120 decreases. The non-volatile memory device 120 may store the encoding data EDT. The non-volatile memory device 120 may provide the encoding data EDT to the shape decoder 114 depending on a request of the shape decoder 114.

The shape decoder 114 may communicate with the host 11 and the non-volatile memory device 120. The shape decoder 114 may receive the read command corresponding to the raw data DT from the host 11. The shape decoder 114 may request the encoding data EDT from the non-volatile memory device 120 based on the read command. The shape decoder 114 may decode the encoding data EDT to generate decoding data DDT. The shape decoder 114 may provide the host 11 with the decoding data DDT as read data. When the decoding data DDT are provided to the host 11, the read command from the host 11 may be completely processed.

Figure 8:
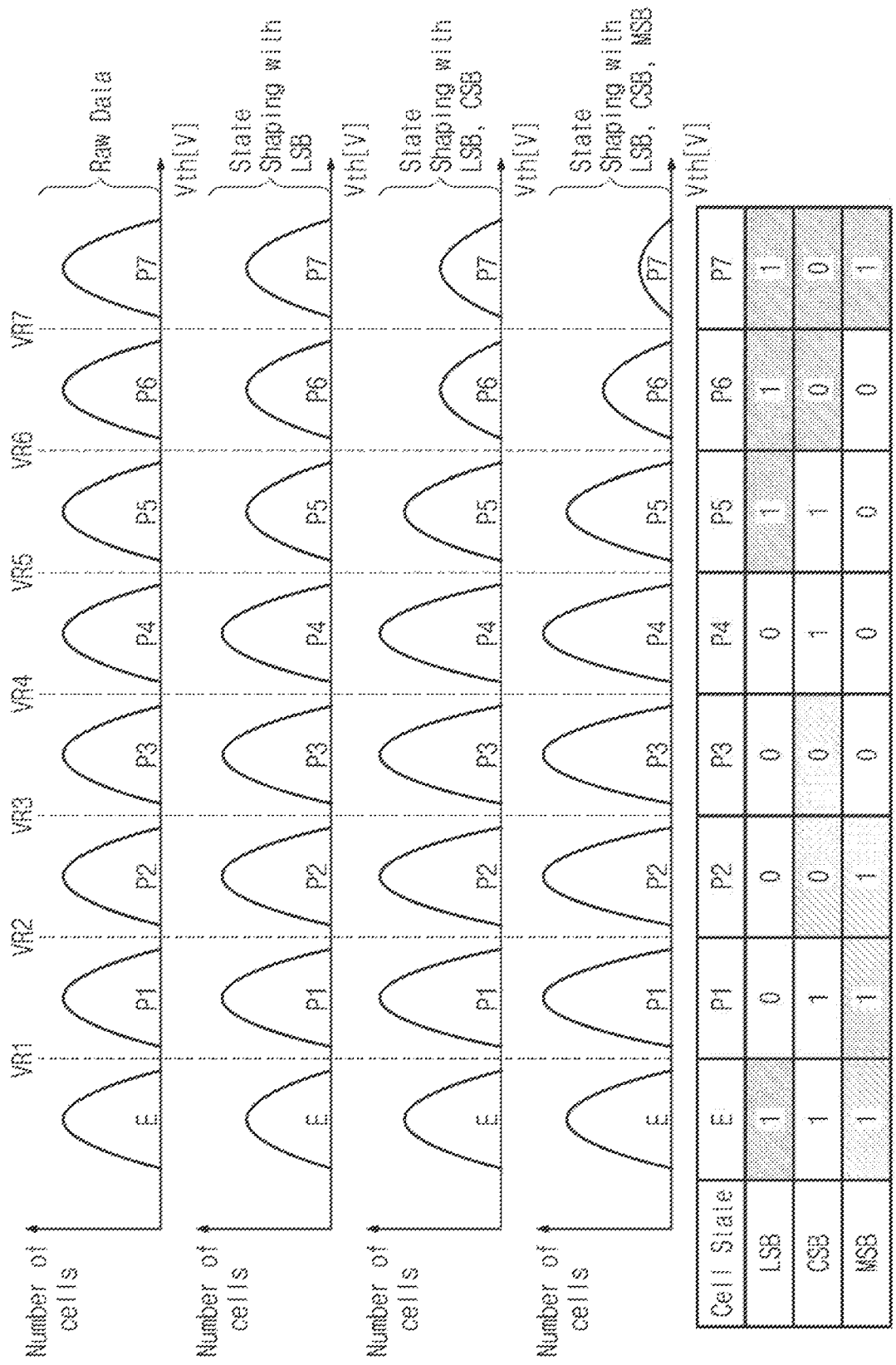
FIG. 8 is a diagram describing state shaping according to some embodiments.

FIG. 8 is a diagram describing a state shaping according to some embodiments. Graphs and a table for describing an example of the state shaping of the triple level cell TLC are illustrated in FIG. 8. In the graphs, a horizontal axis represents a threshold voltage Vth in volts, and a vertical axis represents the number of memory cells. Logical values according to a threshold voltage state of a memory cell and a logical page will be described with reference to the table.

Below, for convenience of description, the state shaping for the least significant bit LSB is referred to as a "first state shaping". After the first state shaping, a state shaping that is further applied to the center significant bit CSB is referred to as a "second state shaping". After the second state shaping, a state shaping that is further applied to the most significant bit MSB is referred to as a "third state shaping". The bits experiencing the third state shaping may be also referred to as "encoding data".

Referring to the graph corresponding to raw data, the raw data may include a series of bits each corresponding to one of a plurality of threshold voltage states. Each of the series of bits may indicate a threshold voltage state to be programmed to memory cells of a non-volatile memory device. In the case where a memory cell is implemented with the triple level cell TLC, each of a series of bits of raw data may correspond to one of the erase state "E" and the first to seventh programming states P1, P2, P3, P4, P5, P6, and P7. A target threshold voltage state of the plurality of threshold voltage states may be the seventh programming state P7.

Referring to the graph corresponding to the first state shaping, the number of first target bits of the series of bits in the raw data may decrease. Logical values of the first target bits may be equal to a logical value of a target threshold voltage state, in a first page corresponding to the least significant bit LSB from among a plurality of pages. For example, in the first page, a logical value of the seventh programming state P7 being the target threshold voltage state may be "1". The first target bits may be bits corresponding to the erase state "E" and the fifth, sixth, and seventh programming states P5, P6, and P7.

When the first state shaping is performed, the number of bits corresponding to the erase state "E" and the fifth, sixth, and seventh programming states P5, P6, and P7 may decrease, and the number of bits corresponding to the first, second, third, and fourth programming states P1, P2, P3, and P4 may increase.

Referring to a row corresponding to the least significant bit LSB in the table, threshold voltage states corresponding to the first target bits are deeply shaded. After the first state shaping is performed, first indicator data may indicate bits corresponding to the erase state "E" and the fifth, sixth, and seventh programming states P5, P6, and P7. The first indicator data may be used in the second state shaping.

The first indicator data may include a series of first indicator bits. In the first page, each of the first indicator bits may have a first value when a logical value of a corresponding threshold voltage is equal to a logical value of the target threshold voltage state and may have a second value if not. For example, a value of each of the first indicator bits may be set to the first value when a corresponding bit of the bits to which the first state shaping is applied corresponds to the first target bits and may be set to the second value when the corresponding bit of the bits to which the first state shaping is applied does not correspond to the first target bits.

Referring to the graph corresponding to the second state shaping, the number of second target bits of the series of bits to which the first state shaping is applied may decrease. The second target bits may be some of the first target bits. Logical values of the second target bits may be equal to a logical value of the target threshold voltage state, in a second page corresponding to the center significant bit CSB from among the plurality of pages. For example, the second target bits may be some of the first target bits corresponding to the erase state "E" and the fifth, sixth, and seventh programming states P5, P6, and P7. In the second page, a logical value of the seventh programming state P7 being the target threshold voltage state may be "0". Accordingly, the second target bits may be bits corresponding to the sixth and seventh programming states P6 and P7.

When the second state shaping is performed, the number of bits corresponding to the sixth and seventh programming states P6 and P7 may decrease, and the number of bits corresponding to the erase state "E" and the first, second, third, fourth, and fifth programming states P1, P2, P3, P4, and P5 may increase.

Referring to a row corresponding to the center significant bit CSB in the table, threshold voltage states each having a logical value equal to the logical value of the target threshold voltage state are thinly shaded. Threshold voltage states corresponding to the second target bits are deeply shaded. After the second state shaping is performed, second indicator data may indicate bits corresponding to the sixth and seventh programming states P6 and P7. The second indicator data may be used in the third state shaping.

The second indicator data may include a series of second indicator bits. In both the first page and the second page, each of the second indicator bits may have the first value when a logical value of a corresponding threshold voltage is equal to the logical value of the target threshold voltage state and may have the second value if not. For example, a value of each of the second indicator bits may be set to the first value when a corresponding bit of the bits to which the second state shaping is applied corresponds to the second target bit and may be set to the second value when the corresponding bit of the bits to which the second state shaping is applied does not correspond to the second target bit.

Referring to the graph corresponding to the third state shaping, the number of third target bits of the series of bits to which the second state shaping may decrease. The third target bits may be some of the second target bits. Logical values of the third target bits may be equal to a logical value of the target threshold voltage state, in a third page corresponding to the most significant bit MSB from among the plurality of pages. For example, the third target bits may be some of the second target bits corresponding to the sixth and seventh programming states P6 and P7. In the third page, a logical value of the seventh programming state P7 being the target threshold voltage state may be "1". Accordingly, the third target bits may be bits corresponding to the seventh programming state P7.

When the third state shaping is performed, the number of bits corresponding to the seventh programming state P7 may decrease, and the number of bits corresponding to the erase state "E" and the first, second, third, fourth, fifth, and sixth programming states P1, P2, P3, P4, P5, and P6 may increase.

Referring to a row corresponding to the most significant bit MSB in the table, threshold voltage states each having a logical value equal to the logical value of the target threshold voltage state are thinly shaded. Threshold voltage states corresponding to the third target bits are deeply shaded. Because the third page corresponding to the most significant bit MSB is the last page, an operation of generating third indicator data for the state shaping of a next page may be omitted.

The series of bits to which the third state shaping is applied may be stored in the non-volatile memory device 120 of FIG. 1 as encoding data.

Figure 9:
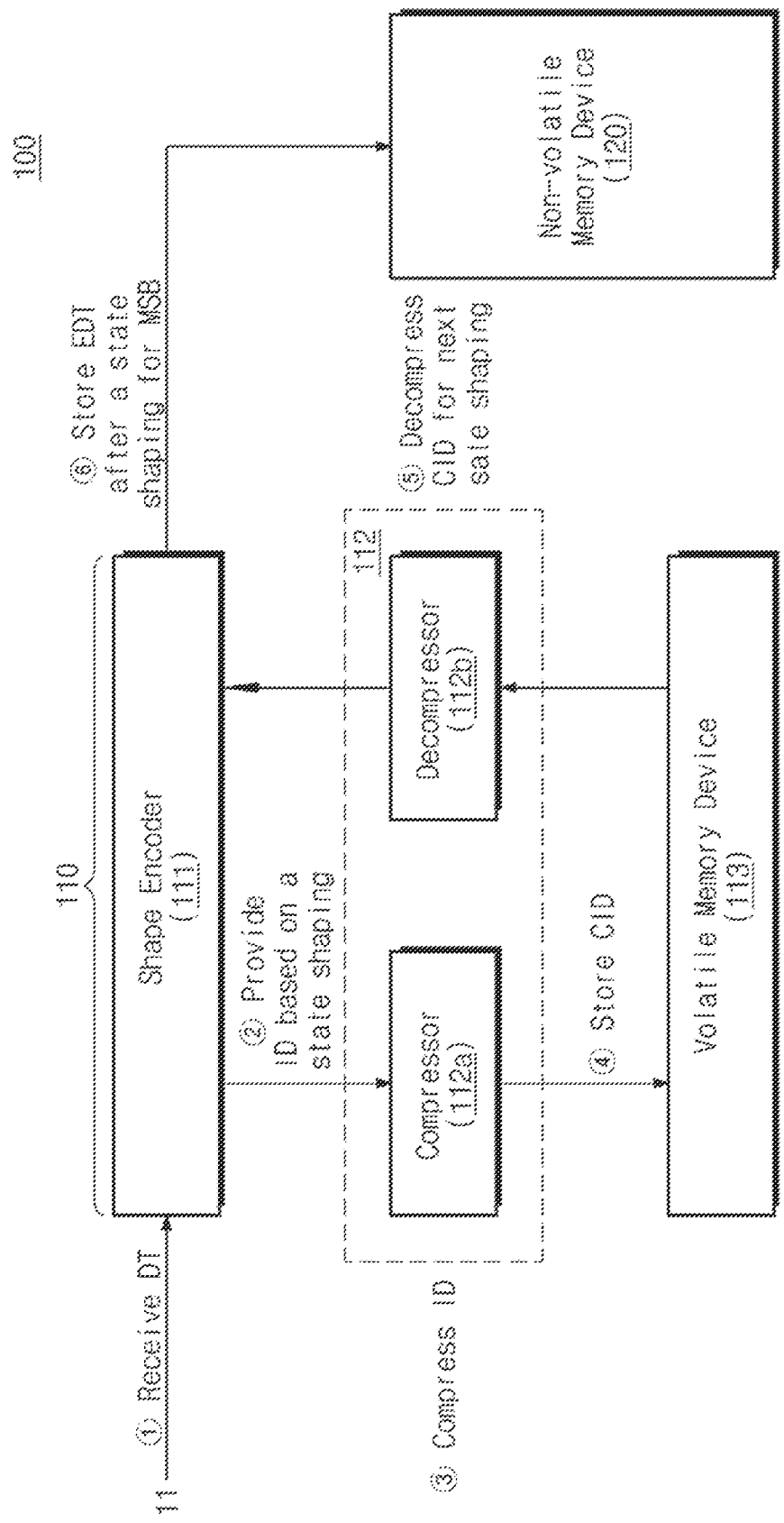
FIG. 9 is a diagram describing a method of operating a storage device according to some embodiments.

FIG. 9 is a diagram describing a method of operating a storage device according to some embodiments. A method of operating the storage device 100 according to some embodiments will be described with reference to FIG. 9. The storage device 100 may communicate with the host 11.

The storage device 100 may include the storage controller 110 and the non-volatile memory device 120. The storage controller 110 may include the shape encoder 111, the compression circuit 112, and the volatile memory device 113. The compression circuit 112 may include the compressor 112a and the decompressor 112b.

Below, the method of operating the storage device 100 according to some embodiments of the present disclosure will be described.

In a first operation ①, the shape encoder 111 may receive the raw data DT from the host 11. The raw data DT may include a series of bits each corresponding to one of a plurality of threshold voltage states. The shape encoder 111 may encode the raw data DT. The encoding may include a plurality of state shaping respectively corresponding to a plurality of pages. The state shaping may be based on indicator data corresponding to a previous page.

In a second operation ②, the shape encoder 111 may provide the compressor 112a with the indicator data ID generated based on the state shaping. The indicator data ID may indicate target bits of the series of bits to which the state shaping is applied. The target bits may have a logical value equal to a logical value of a target threshold voltage state, in a previous page or pages and a current page. The second operation ② may be omitted when the state shaping is associated with the last page corresponding to the most significant bit MSB.

In a third operation ③, the compressor 112a may compress the indicator data ID. The compressor 112a may generate the compressed indicator data CID. A method in which the compressor 112a compresses the indicator data ID will be described in detail with reference to FIGS. 10 and 11.

In a fourth operation ④, the compressor 112a may provide the compressed indicator data CID to the volatile memory device 113. The volatile memory device 113 may store the compressed indicator data CID.

In a fifth operation ⑤, the decompressor 112b may decompress the compressed indicator data CID for the purpose of a next state shaping. For example, to perform the state shaping on the next page, the shape encoder 111 may request the compressed indicator data CID from the volatile memory device 113. The volatile memory device 113 may provide the compressed indicator data CID to the decompressor 112b. The decompressor 112b may decompress the compressed indicator data CID and may provide the decompressed indicator data DID to the shape encoder 111. The shape encoder 111 may perform the state shaping on the next page based on the decompressed indicator data DID.

The second operation ② to the fifth operation ⑤ may be repeatedly performed until the shape encoder 111 performs the state shaping on the last page indicating the most significant bit MSB.

In a sixth operation ⑥, the shape encoder 111 may perform the state shaping for the most significant bit MSB and may then store the encoding data EDT in the non-volatile memory device 120. The encoding data EDT may include a series of bits to which the state shaping for all the pages is cumulatively applied.

Figure 10:
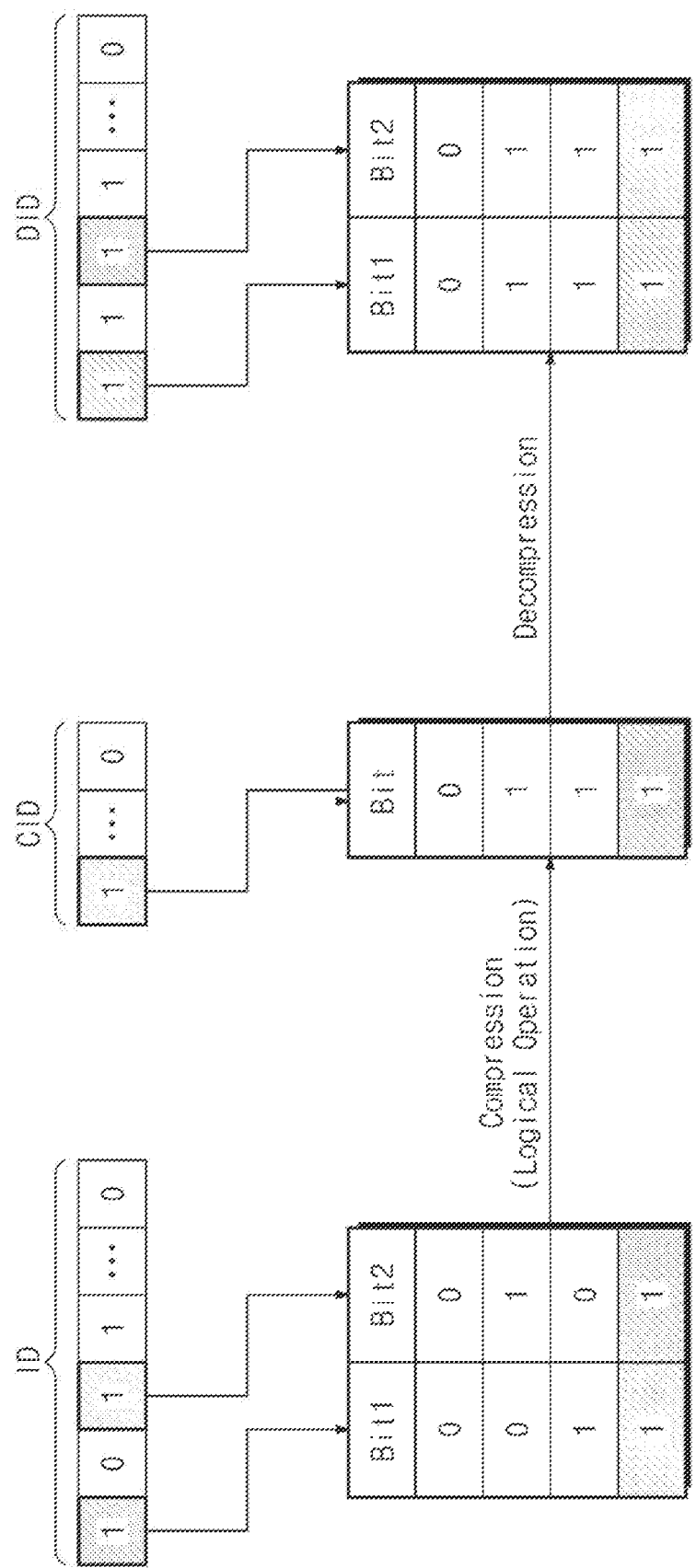
FIG. 10 is a diagram describing a compression and a decompression of indicator data according to some embodiments.

FIG. 10 is a diagram describing a compression and a decompression of indicator data according to some embodiments. An operation in which the compressor 112a compresses the indicator data ID and an operation in which the decompressor 112b decompresses the compressed indicator data CID will be described with reference to FIGS. 9 and 10.

According to some embodiments, a compression circuit may compress the indicator data ID by performing a logical operation on arbitrary bits. For better understanding, a 2-bit OR operation is illustrated in FIG. 10, but embodiments are not limited thereto. The logical operation may use 2 or more bits as input values, and may include various kinds of logical operations such as an AND operation, an XOR operation, and a NOR operation, in addition to the OR operation.

The indicator data ID may include a series of indicator bits. The compressor 112a may arbitrarily choose two bits of a series of indicator bits. The two bits thus chosen may be used as a first input bit and a second input bit for the logical operation. The compressor 112a may calculate an output bit based on the logical operation. A value of the output bit may correspond to a result of performing the logical operation on a value of the first input bit and a value of the second input bit.

For example, the compressor 112a may choose the first bit and the third bit of a series of indicator bits in the indicator data ID. A logical value of the first bit may be "1". A logical value of the third bit may be "1". The compressor 112a may calculate the output bit having a logical value of "1" based on the OR operation.

As in the above description, the compressor 112a may generate the compressed indicator data CID by performing the logical operation on all the indicator bits of the indicator data ID. In the embodiment in which two bits are compressed to one bit, the size of the compressed indicator data CID may be half the size of the indicator data ID. As such, the capacity that is used for the volatile memory device 113 to manage indicator data may be reduced by half.

The compressed indicator data CID may include a series of compressed indicator bits. The decompressor 112b may decompress the series of compressed indicator bits.

For example, the compressor 112a may compress the first bit and the third bit of the series of indicator bits in the indicator data ID. As in the compression operation of the compressor 112a, the decompressor 112b may recover the first bit and the third bit of the decompressed indicator data DID based on the first bit of the series of compressed indicator bits.

In some embodiments, the indicator data ID may be different from the decompressed indicator data DID. For example, since information of different bit values is lost in the process of compressing the indicator data ID, bit values of the decompressed indicator data DID may be different from the bit values of the indicator data ID. A decrease in the capacity of the volatile memory device 113 may be more advantageous than the reduction of reliability due to the information loss from the compression and decompression. As such, it may be advantageous to have a way to minimize the information loss coming from the compression and decompression.

Figure 11:
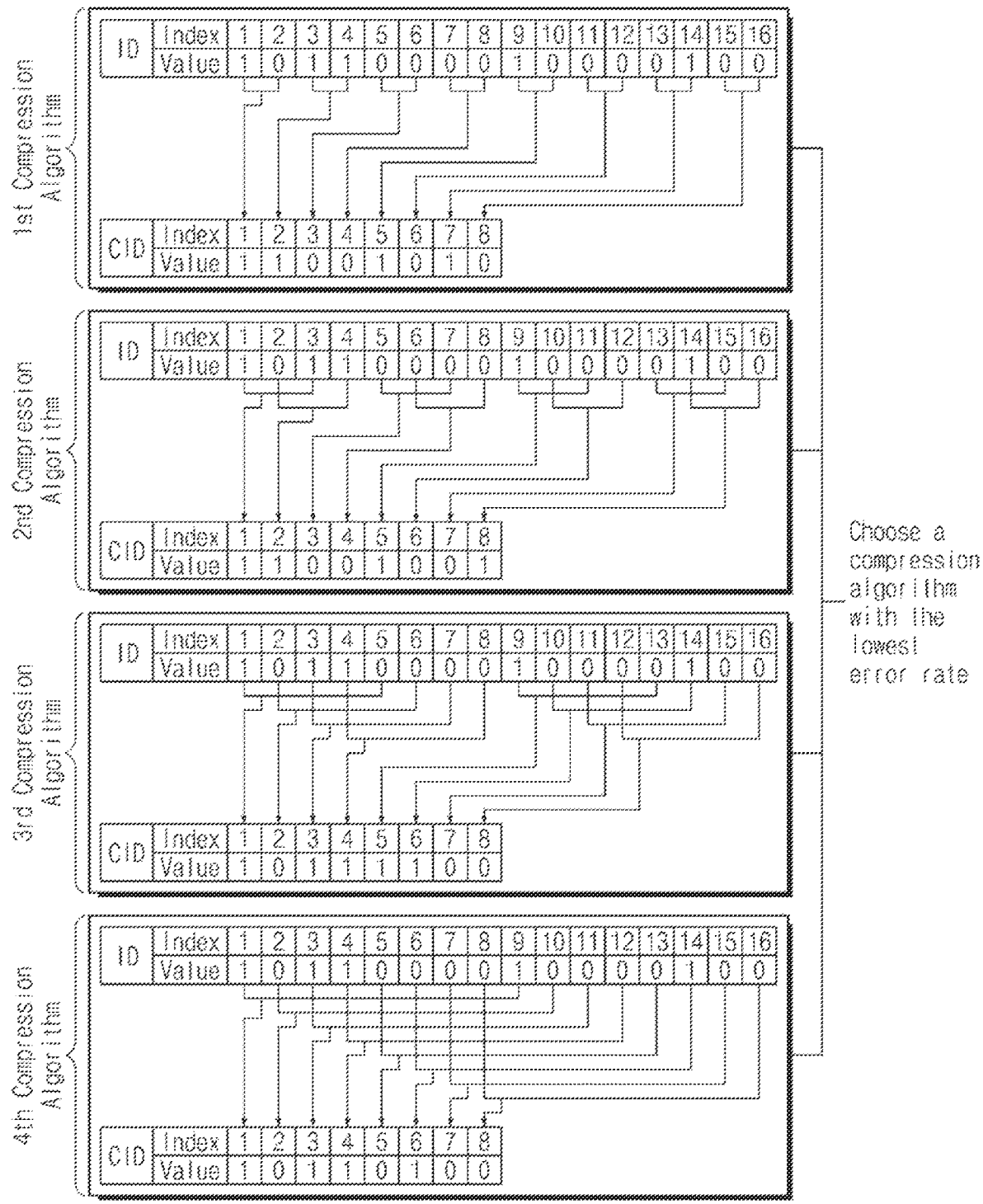
FIG. 11 is a diagram describing compression algorithms according to some embodiments.

FIG. 11 is a diagram describing compression algorithms according to some embodiments. Referring to FIGS. 9, 10, and 11, the compressor 112a may choose a compression algorithm, which has the lowest error rate with regard to a corresponding page, from among a plurality of compression algorithms. The error rate may indicate a ratio of bits different from bits of the indicator data ID from among all the bits of the decompressed indicator data DID. That is, as the error rate becomes lower, a difference between the indicator data ID and the decompressed indicator data DID may become smaller.

In some embodiments, the compressor 112a may compress the indicator data ID based on the 2-bit OR operation.

The indicator data ID may include first to N-th indicator bits. Herein, "N" is a natural number of 2 or more. For example, "N" may be "16" as illustrated in the example of FIG. 11.

The compressor 112a may choose the first indicator bit and the $(1+2^M)$-th indicator bit from the first to N-th indicator bits. The compressor 112a may decide a logical value of the first compressed indicator bit of the compressed indicator data CID based on the first indicator bit and the $(1+2^M)$-th indicator bit. As in the above description, the compressor 112a may choose a pair of indicator bits for a next logical operation from the first to N-th indicator bits, and may decide logical values of the remaining compressed indicator bits of the compressed indicator data CID. Herein, "M" is an integer being not a negative number.

According to the first compression algorithm, "N" may be 16, and "M" may be 0. The compressor 112a may decide a logical value of the first compressed indicator bit of the compressed indicator data CID based on the first indicator bit and the second indicator bit. The compressor 112a may decide a logical value of the second compressed indicator bit of the compressed indicator data CID based on the third indicator bit and the fourth indicator bit. As in the above description, the compressor 112a may decide logical values of the third to eighth compressed indicator bits of the compressed indicator data CID, based on the first compression algorithm.

According to the second compression algorithm, "N" may be 16, and "M" may be 1. The compressor 112a may decide a logical value of the first compressed indicator bit of the compressed indicator data CID based on the first indicator bit and the third indicator bit. The compressor 112a may decide a logical value of the second compressed indicator bit of the compressed indicator data CID based on the second indicator bit and the fourth indicator bit. As in the above description, the compressor 112a may decide logical values of the third to eighth compressed indicator bits of the compressed indicator data CID, based on the second compression algorithm.

According to the third compression algorithm, "N" may be 16, and "M" may be 2. The compressor 112a may decide a logical value of the first compressed indicator bit of the compressed indicator data CID based on the first indicator bit and the fifth indicator bit. The compressor 112a may decide a logical value of the second compressed indicator bit of the compressed indicator data CID based on the second indicator bit and the sixth indicator bit. As in the above description, the compressor 112a may decide logical values of the third to eighth compressed indicator bits of the compressed indicator data CID, based on the third compression algorithm.

According to the fourth compression algorithm, "N" may be 16, and "M" may be 3. The compressor 112a may decide a logical value of the first compressed indicator bit of the compressed indicator data CID based on the first indicator bit and the ninth indicator bit. The compressor 112a may decide a logical value of the second compressed indicator bit of the compressed indicator data CID based on the second indicator bit and the tenth indicator bit. As in the above description, the compressor 112a may decide logical values of the third to eighth compressed indicator bits of the compressed indicator data CID, based on the fourth compression algorithm.

According to some embodiments, the shape encoder 111 may have information about a compression algorithm optimized for each of a plurality of pages. The optimized compression algorithm may refer to a compression algorithm, which has the lowest error rate with regard to a corresponding page, from among a plurality of compression algorithms. The shape encoder 111 may control the compressor 112a such that indicator data are compressed depending on a compression algorithm optimized for each page.

For example, the shape encoder 111 may perform a first state shaping on a first page to generate first indicator data. Under control of the shape encoder 111, the compressor 112a may compress the first indicator data based on a first compression algorithm, which has the lowest error rate with regard to the first page, from among a plurality of compression algorithms. The shape encoder 111 may perform a second state shaping on a second page to generate second indicator data. Under control of the shape encoder 111, the compressor 112a may compress the second indicator data based on a second compression algorithm, which has the lowest error rate with regard to the second page, from among a plurality of compression algorithms.

The first to fourth compression algorithms are described with reference to FIG. 11. However, embodiments are not limited thereto. For example, one skilled in the art may understand that compression algorithms may be variously changed or modified depending on the number of bits used in the logical operation, a type of the logical operation, and values of "N" and "M".

Figure 12:
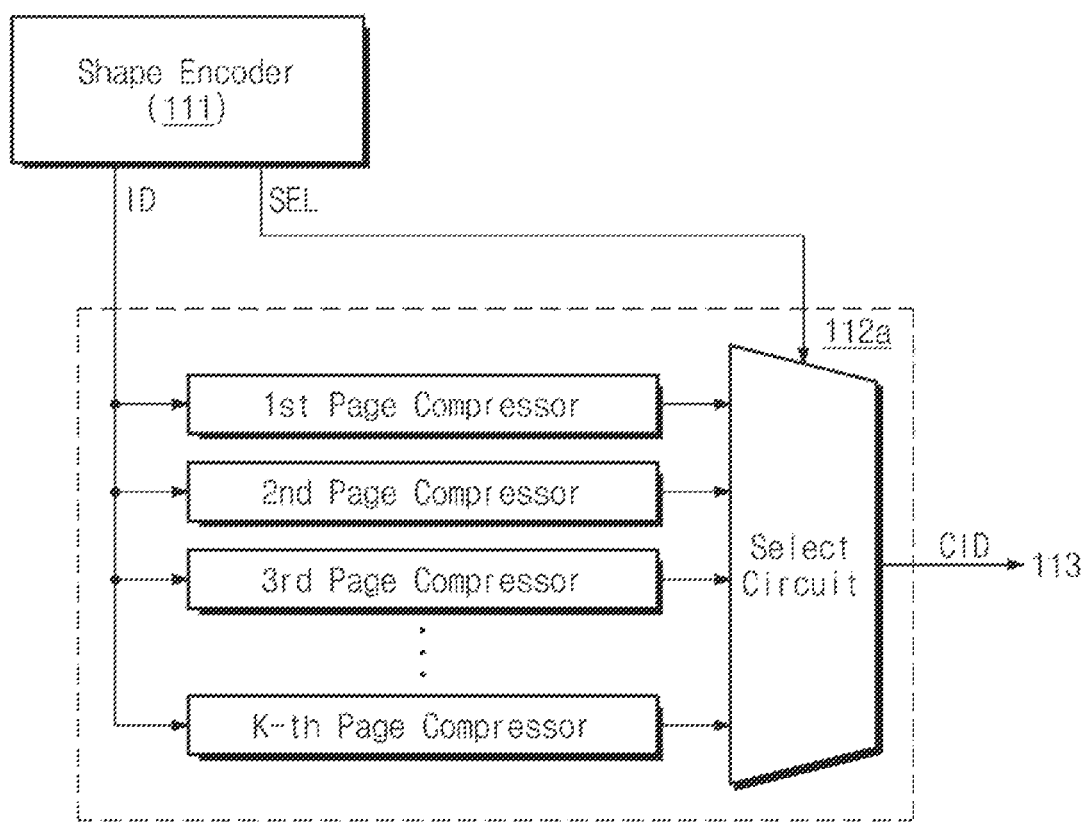
FIG. 12 is a block diagram of a compressor according to some embodiments.

FIG. 12 is a block diagram of a compressor according to some embodiments. Referring to FIG. 12, the compressor 112a may communicate with the shape encoder 111 and the volatile memory device 113.

The compressor 112a may receive the indicator data ID and a selection signal SEL from the shape encoder 111. The indicator data ID may indicate target bits of a series of bits to which the state shaping is applied. The selection signal SEL may be used to select a compressor that will provide the compressed indicator data CID.

The compressor 112a may include first to K-th page compressors and a select circuit. Herein, "K" is an arbitrary natural number and may indicate the number of pages. For example, in the case where raw data corresponding to the indicator data ID are data to be stored in the triple level cell TLC, "K" may be 3.

The first to K-th page compressors may receive the indicator data ID from the shape encoder 111. The first to K-th page compressors may provide the select circuit with signals obtained by compressing the indicator data ID.

In some embodiments, each of the first to K-th page compressors may be configured to perform a compression algorithm optimized for the corresponding page.

The select circuit may select one of the signals from the first to K-th page compressors in response to the selection signal SEL and may output the selected signal as the compressed indicator data CID. The compressed indicator data CID selected by the select circuit may be provided to the volatile memory device 113.

Figure 13:
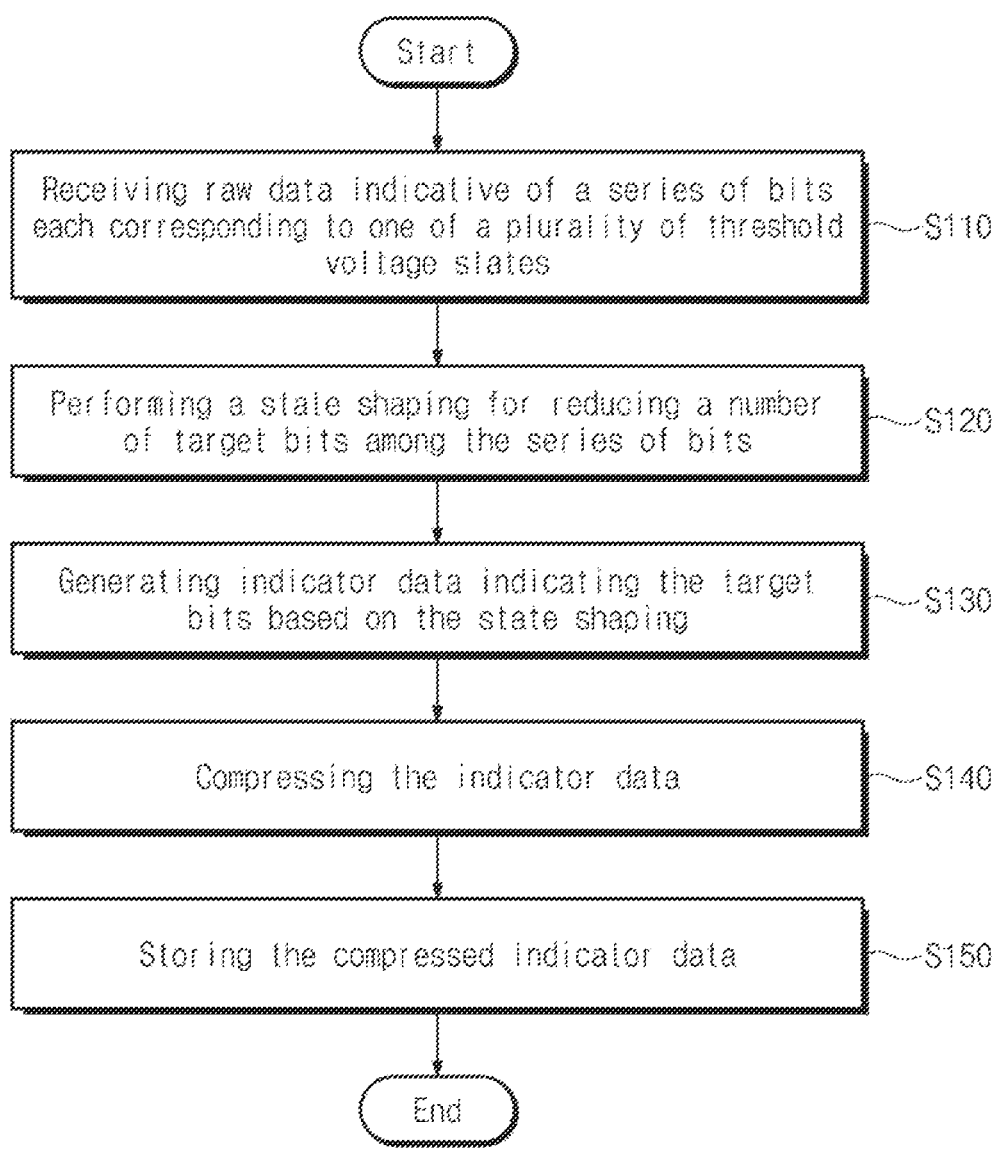
FIG. 13 is a flowchart describing a method of operating a storage controller according to some embodiments.

FIG. 13 is a flowchart describing a method of operating a storage controller according to some embodiments. A method of operating a storage controller according to some embodiments will be described with reference to FIG. 13. The storage controller may communicate with a non-volatile memory device. The storage controller may correspond to the storage controller 110 of FIGS. 1, 2, 7, and 9.

In operation S110, the storage controller may receive raw data indicating a series of bits each corresponding to one of a plurality of threshold voltage states. The raw data may be write data corresponding to a write command. The plurality of threshold voltage states may be determined depending on a type of memory cells of the non-volatile memory device communicating with the storage controller.

In operation S120, the storage controller may perform the state shaping for reducing the number of target bits of a series of bits. Logical values of the target bits may be equal to a logical value of a target threshold voltage state of the plurality of threshold voltage states, in a target page of a plurality of pages.

In operation S130, the storage controller may generate indicator data indicating the target bits based on the state shaping in operation S120.

In operation S140, the storage controller may compress the indicator data. In some embodiments, the storage controller may compress the indicator data based on a compression algorithm optimized for the target page.

In operation S150, the storage controller may store the compressed indicator data. For example, the storage controller may include a volatile memory device operating as a buffer memory. The storage controller may store the compressed indicator data in the volatile memory device. The compressed indicator data of the volatile memory device may be used for the storage controller to perform the state shaping on a next page.

Figure 14:
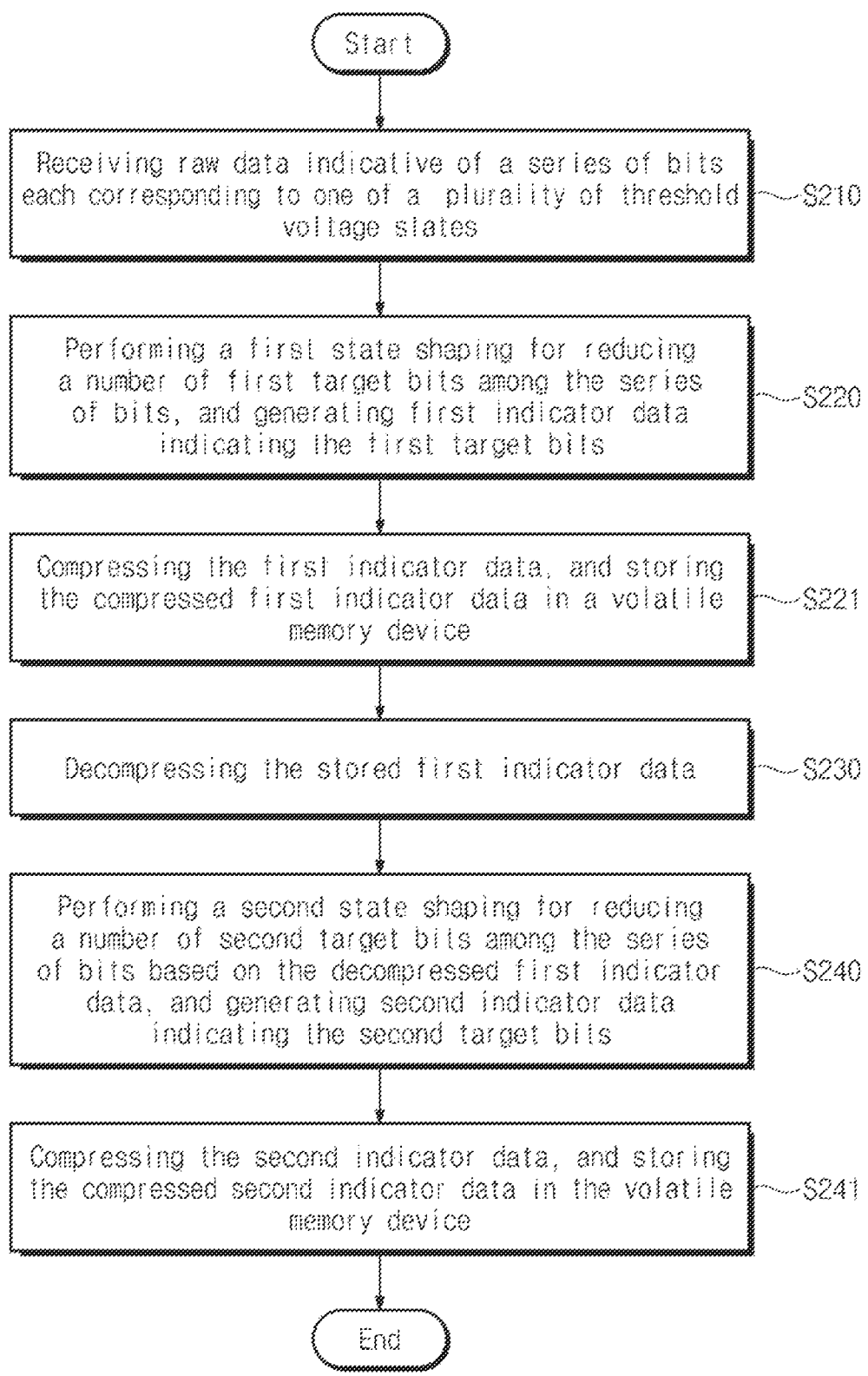
FIG. 14 is a flowchart describing a method of operating a storage controller according to some embodiments.

FIG. 14 is a flowchart describing a method of operating a storage controller according to some embodiments. A method of operating a storage controller according to some embodiments will be described. The storage controller may communicate with a host and a non-volatile memory device. The storage controller may correspond to the storage controller 110 of FIGS. 1, 2, 7, and 9.

In operation S210, the storage controller may receive raw data indicating a series of bits each corresponding to one of a plurality of threshold voltage states.

In operation S220, the storage controller may perform a first state shaping for reducing the number of first target bits among the series of bits, and may generate first indicator data indicating the first target bits. Logical values of the first target bits may be equal to a logical value of a target threshold voltage state of the plurality of threshold voltage states, in a first page of a plurality of pages. The storage controller may generate the first indicator data indicating the first target bits based on the first state shaping.

In operation S221, the storage controller may compress the first indicator data, and store the compressed first indicator data in a volatile memory device. For example, the volatile memory device may be present in the storage controller.

In operation S230, the storage controller may decompress the first indicator data present in the volatile memory device.

In operation S240, the storage controller may perform a second state shaping for reducing the number of second target bits of the series of bits to which the first state shaping is applied, based on the decompressed first indicator data, and may generate second indicator data indicating the second target bits. The second target bits may be some of the first target bits. Logical values of the second target bits may be equal to a logical value of the target threshold voltage state of the plurality of threshold voltage states, in a second page of the plurality of pages. The storage controller may generate the second indicator data indicating the second target bits based on the second state shaping.

In operation S241, the storage controller may compress the second indicator data, and may store the compressed second indicator data in the volatile memory device present in the storage controller.

In some embodiments, the storage controller may apply a different compression algorithm for each page. For example, the storage controller may support a plurality of compression algorithms for compressing indicator data. A first compression algorithm of the plurality of compression algorithms may provide the lowest error rate with regard to the first page. A second compression algorithm of the plurality of compression algorithms may provide the lowest error rate with regard to the second page. The compression of the first indicator data in operation S221 may be based on the first compression algorithm. The compression of the second indicator data in operation S241 may be based on the second compression algorithm.

According to various embodiments of the present disclosure, a storage controller compressing indicator data, a storage device including the same, and a method of operating the same are provided.

Also, a storage controller that decreases a capacity of a nonvolatile memory device by compressing indicator data, reduces an error rate by compressing the indicator data by using a compression algorithm optimized for each page, and provides improved reliability, a storage device including the same, and a method of operating the same are provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A method of operating a storage controller, the method comprising:
    receiving raw data indicating a series of bits each corresponding to one of a plurality of threshold voltage states;
    performing a first state shaping for reducing a number of first target bits of the series of bits, logical values of the first target bits being equal to a logical value of a target threshold voltage state of the plurality of threshold voltage states in a first page of a plurality of pages;
    generating first indicator data that indicates the first target bits based on the first state shaping;
    performing a second state shaping for reducing a number of second target bits of the series of bits to which the first state shaping is applied, the second target bits being some of the first target bits and logical values of the second target bits being equal to a logical value of the target threshold voltage state in a second page of the plurality of pages;
    generating second indicator data that indicates the second target bits, based on the second state shaping;
    compressing the first indicator data using a first compression algorithm optimized for the first page;
    compressing the second indicator data using a second compression algorithm optimized for the second page; and
    storing the compressed first indicator data and the compressed second indicator data.

2. The method of claim 1, further comprising:
    decompressing the compressed first indicator data that is stored,
    wherein the second state shaping is performed based on the decompressed first indicator data.

3. The method of claim 2, wherein:
    the first compression algorithm has a lowest error rate with regard to the first page, from among a plurality of compression algorithms, and
    the second compression algorithm has a lowest error rate with regard to the second page, from among the plurality of compression algorithms.

4. The method of claim 2, further comprising:
    decompressing the compressed second indicator data that is stored;
    performing a third state shaping for reducing a number of third target bits of the series of bits to which the second state shaping is applied, based on the decompressed second indicator data, the third target bits being some of the second target bits and logical values of the third target bits being equal to a logical value of the target threshold voltage state in a third page of the plurality of pages; and
    storing the series of bits, to which the third state shaping is applied, in a plurality of memory cells of a non-volatile memory device as encoding data.

5. The method of claim 4, wherein each of the plurality of memory cells is implemented with a triple level cell (TLC), and
    wherein the first page, the second page, and the third page correspond to a least significant bit, a center significant bit, and a most significant bit, respectively.

6. The method of claim 2, further comprising:
    decompressing the compressed second indicator data that is stored;
    performing a third state shaping for reducing a number of third target bits of the series of bits to which the second state shaping is applied, based on the decompressed second indicator data, the third target bits being some of the second target bits and logical values of the third target bits being equal to a logical value of the target threshold voltage state in a third page of the plurality of pages;
    generating third indicator data that indicates the third target bits based on the third state shaping;
    compressing the third indicator data;
    storing the compressed third indicator data;
    decompressing the compressed third indicator data that is stored;
    performing a fourth state shaping for reducing a number of fourth target bits of the series of bits to which the third state shaping is applied, based on the decompressed third indicator data, the fourth target bits being some of the third target bits and logical values of the fourth target bits being equal to a logical value of the target threshold voltage state in a fourth page of the plurality of pages; and
    storing the series of bits, to which the fourth state shaping is applied, in a plurality of memory cells of a non-volatile memory device as encoding data.

7. The method of claim 6, wherein each of the plurality of memory cells is implemented with a quadruple level cell (QLC), and
    wherein the first page, the second page, the third page, and the fourth page correspond to a least significant bit, a first center significant bit, a second center significant bit, and a most significant bit, respectively.

8. The method of claim 1, wherein the first indicator data include a series of indicator bits corresponding to the series of bits to which the first state shaping is applied, and
    wherein a value of each of the series of indicator bits is set to:
    a first value when a corresponding bit of the series of bits to which the first state shaping is applied corresponds to the first target bits; and
    a second value when the corresponding bit does not correspond to the first target bits.

9. The method of claim 1, wherein the first indicator data include a series of indicator bits corresponding to the series of bits to which the first state shaping is applied, and
    wherein the first compression algorithm applies a logical operation to arbitrary two bits of the series of indicator bits.

10. The method of claim 9, wherein the series of indicator bits of the first indicator data are first to N-th indicator bits, wherein the first compression algorithm includes performing the logical operation on a first indicator bit of the first to N-th indicator bits and a $(1+2^M)$ indicator bit of the first to N-th indicator bits, "N" being a natural number of 2 or more, and "M" being an integer that is not a negative number.

11. The method of claim 1, wherein the target threshold voltage state is a state having a highest in voltage level from among the plurality of threshold voltage states.

12. The method of claim 1, wherein the storage controller is configured to communicate with a vertical NAND (VNAND)-based non-volatile memory device.

13. The method of claim 1, wherein the storing of the compressed first indicator data includes storing the first indicator data in a volatile memory device present in the storage controller.

14. The method of claim 1, further comprising:
decompressing the compressed first indicator data that is stored;
generating encoding data by applying a VNAND state shaping (VSS) encoding to the raw data based on the decompressed first indicator data and the series of bits to which the first state shaping is applied; and
storing the encoding data in a non-volatile memory device.

15. The method of claim 14, further comprising:
receiving a read command corresponding to the raw data;
reading the encoding data stored in the non-volatile memory device, based on the read command; and
performing a VSS decoding on the encoding data.

16. A storage controller comprising:
a shape encoder configured to receive raw data indicating a series of bits each corresponding to one of a plurality of threshold voltage states, to perform a first state shaping for reducing a number of first target bits of the series of bits for a first page of a plurality of pages, to generate first indicator data that indicates the first target bits based on the first state shaping, to perform a second state shaping for reducing a number of second target bits of the series of bits to which the first state shaping is applied for a second page of the plurality of pages, and to generate second indicator data that indicates the second target bits based on the second state shaping;
a compressor configured to compress the first indicator data and to compress the second indicator data; and
a volatile memory device configured to store the compressed first indicator data and the compressed second indicator data,
wherein logical values of the first target bits are equal to a logical value of a target threshold voltage state of the plurality of threshold voltage states in a first page of a plurality of pages,
logical values of the second target bits are equal to a logical value of a target threshold voltage state of the plurality of threshold voltage states in a second page of a plurality of pages,
the compressor compresses the first indicator data using a first compression algorithm optimized for the first page, and
the compressor compresses the second indicator data using a second compression algorithm optimized for the second page.

17. The storage controller of claim 16, further comprising:
a decompressor configured to decompress the compressed first indicator data that is stored in the volatile memory device,
wherein the shape encoder is further configured to:
receive the decompressed first indicator data from the decompressor; and
perform the second state shaping, based on the decompressed first indicator data,
wherein
the second target bits are some of the first target bits.

18. The storage controller of claim 17, wherein the
first compression algorithm has a lowest error rate with regard to the first page, from among a plurality of compression algorithms, and
the second compression algorithm has a lowest error rate with regard to the second page, from among the plurality of compression algorithms.

19. A storage device comprising:
a storage controller configured to receive raw data indicating a series of bits each corresponding to one of a plurality of threshold voltage states and to perform a plurality of state shaping operations on the raw data to generate encoding data; and
a non-volatile memory device configured to store the encoding data,
wherein the storage controller includes:
a shape encoder configured to perform a first state shaping of the plurality of state shaping operations to reduce a number of first target bits of the series of bits for a first page of a plurality of pages, to generate first indicator data that indicates the first target bits based on the first state shaping, to perform a second state shaping for reducing a number of second target bits of the series of bits to which the first state shaping is applied for a second page of the plurality of pages, and to generate second indicator data that indicates the second target bits based on the second state shaping;
a compressor configured to compress the first indicator data and the second indicator data; and
a volatile memory device configured to store the compressed first indicator data and the compressed second indicator data,
wherein logical values of the first target bits are equal to a logical value of a target threshold voltage state of the plurality of threshold voltage states in a first page of a plurality of pages,
logical values of the second target bits are equal to a logical value of a target threshold voltage state of the plurality of threshold voltage states in a second page of a plurality of pages,
the compressor compresses the first indicator data using a first compression algorithm optimized for the first page, and
the compressor compresses the second indicator data using a second compression algorithm optimized for the second page.

20. The storage device of claim 19, wherein the storage controller further includes a decompressor configured to decompress the compressed first indicator data that is stored in the volatile memory device,
wherein the shape encoder is further configured to:
receive the decompressed first indicator data from the decompressor; and
perform the second state shaping, based on the decompressed first indicator data, and
wherein the second target bits are some of the first target bits.

* * * * *